United States Patent
Urushibara et al.

(10) Patent No.: US 7,292,448 B2
(45) Date of Patent: Nov. 6, 2007

(54) CIRCUIT SUBSTRATE

(75) Inventors: Toshichika Urushibara, Kanagawa (JP); Koji Shiozawa, Aichi (JP); Masakazu Okabe, Aichi (JP); Yukiko Hyodo, Aichi (JP); Yusuke Masuda, Aichi (JP); Tadayuki Miyamoto, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/508,939

(22) Filed: Aug. 24, 2006

(65) Prior Publication Data
US 2007/0081309 A1    Apr. 12, 2007

(30) Foreign Application Priority Data
Aug. 31, 2005   (JP)   ............ 2005-252888

(51) Int. Cl.
   *H05K 7/00* (2006.01)
(52) U.S. Cl. ............ 361/748; 361/749; 361/750; 361/751; 174/250; 174/254; 174/264; 174/538; 174/541; 29/830; 29/832; 29/837; 29/846; 156/252; 156/264; 156/291; 156/313; 156/528
(58) Field of Classification Search ............ 174/250, 174/254–264, 538, 541; 361/748–751, 771, 361/803, 760, 772, 777, 778, 779; 29/830, 29/832, 837, 846; 156/252, 253, 264, 289, 156/291, 313, 578
See application file for complete search history.

(56) References Cited
U.S. PATENT DOCUMENTS 4,674,182 A * 6/1987 Igarashi .............. 29/837
4,742,431 A * 5/1988 Igarashi .............. 361/749
5,121,297 A * 6/1992 Haas .............. 361/751
5,144,742 A * 9/1992 Lucas et al. .............. 29/830
5,428,190 A * 6/1995 Stopperan .............. 174/261
5,499,444 A * 3/1996 Doane et al. .............. 29/830
6,099,745 A * 8/2000 McKenney et al. .............. 216/13
6,972,966 B1 * 12/2005 Oishi et al. .............. 361/803
2004/0118595 A1 * 6/2004 Flammer et al. .............. 174/254

(Continued)

FOREIGN PATENT DOCUMENTS

JP    05-075270 A    3/1993

(Continued)

*Primary Examiner*—Dean A. Reichard
*Assistant Examiner*—Xiaoliang Chen
(74) *Attorney, Agent, or Firm*—Rader Fishman & Grauer PLLC; Ronald P. Kananen

(57) ABSTRACT

A circuit substrate includes a first rigid substrate having a plurality of land portions located at a predetermined interval on one surface, a second rigid substrate having a plurality of second land portions located at a predetermined interval on one surface and a flexible wiring board sandwiched by the first and second rigid substrates and which has a plurality of third land portions corresponding to the first land portions on one surface and a plurality of fourth land portions corresponding to the second land portions on the other surface. In this circuit substrate, the second and fourth land portions are displaced from each other relative to the first and third land portions and at least part of the first and third land portions and at least part of the second and fourth land portions are electrically connected to each other, respectively.

12 Claims, 14 Drawing Sheets

U.S. PATENT DOCUMENTS

| | | | |
|---|---|---|---|
| 2005/0016764 A1* | 1/2005 | Echigo et al. | 174/256 |
| 2005/0279529 A1* | 12/2005 | Happoya | 174/262 |
| 2006/0180344 A1* | 8/2006 | Ito et al. | 174/262 |
| 2007/0013041 A1* | 1/2007 | Ishigaki et al. | 257/686 |

FOREIGN PATENT DOCUMENTS

| | | |
|---|---|---|
| JP | 08-136990 A | 5/1996 |
| JP | 11-289141 A | 10/1999 |
| JP | 2004-031682 A | 1/2004 |

* cited by examiner

CIRCUIT SUBSTRATE

CROSS REFERENCES TO RELATED APPLICATIONS

The present invention contains subject matter related to Japanese Patent Application JP 2005-252888 filed in the Japanese Patent Office on Aug. 31, 2005, the entire contents of which being incorporated herein by reference.

BACKGROUND OF THE INVENTION

1. Field of the Invention

The present invention relates to a circuit substrate in which high-density mounting can be realized by integrally sandwiching a flexible wiring board with two rigid substrates.

2. Description of the Related Art

Cited Patent Reference 1, for example, describes an example of this kind of circuit substrate. The Cited Patent Reference 1 describes a method of manufacturing a printed circuit wiring board in which a flexible substrate is sandwiched by rigid substrates. A method of manufacturing a printed circuit wiring board described in the Cited Patent Reference 1 includes a rigid substrate forming process for forming a rigid substrate in which a first wiring pattern is formed on at least one surface by a patterning process, a flexible substrate forming process for forming a flexible substrate in which a second wiring pattern is formed on at least one surface by a patterning process, a laminating process for integrally laminating the flexible substrate and the rigid substrates by sandwiching the flexible substrate with a plurality of rigid substrates, an abrasive grains abrasion mask forming process for forming an abrasive grains abrasion mask with predetermined portions opened on the rigid substrates which become outer layer substrates and an abrasive grains abrasion process for removing the rigid substrates by effecting the abrasive grains abrasion process on the predetermined regions opened on the abrasive grains abrasion mask to thereby expose the flexible substrate to the outside.

According to the printed circuit wiring board manufacturing method having the above-mentioned arrangement described in the Cited Patent Reference 1, since the flexible substrate with flexibility is manufactured in the state in which the flexible substrate is sandwiched by the rigid substrates, a dam need not be formed near the opening of the rigid substrate, manufacturing efficiency can be improved and a cost can be decreased.

[Cited Patent Reference 1]: Japanese Published Patent Application No. 2004-31682

However, in the case of the related-art circuit substrate manufactured by the aforementioned printed circuit wiring method, once the rigid flexible substrate is integrally molded by sandwiching the flexible substrate with the two rigid substrates. After that, the circuit substrate in which a plurality of rigid substrates is integrally formed with one flexible substrate is formed by removing unnecessary portions of the two rigid substrates. For this reason, since a large number of processes are required until the final circuit substrate is manufactured, a large number of processes cause the manufacturing process to become complex and hence it is unavoidable that the circuit substrate should be manufactured expensively.

SUMMARY OF THE INVENTION

The problems that the present invention intends to solve are that the related-art printed circuit wiring board needs a large number of manufacturing processes, the manufacturing process is complex and that a circuit substrate becomes expensive unavoidably. However, according to the present invention, it is possible to easily manufacture a circuit substrate by a simple manufacturing process in which a flexible substrate is sandwiched by two rigid substrates. Therefore, according to the present invention, it becomes possible to manufacture a circuit substrate with a simple arrangement and which is highly reliable in practical use.

According to an aspect of the present invention, there is provided a circuit substrate which includes a first rigid substrate having a plurality of land portions located at a predetermined interval on one surface, a second rigid substrate having a plurality of second land portion located at a predetermined interval on one surface. This circuit substrate further includes a flexible wiring board sandwiched by the first and second rigid substrates and which has a plurality of third land portions corresponding to a plurality of first land portions on one surface and a plurality of fourth land portions corresponding to the second land portions on the other surface. In this circuit substrate, the second land portions and the fourth land portions are displaced from each other relative to the first land portions and the third land portions and at least part of the first land portions and the third land portions and at least part of the second land portions and the fourth land portions are electrically connected to each other, respectively.

According to the circuit substrate of the present invention, it becomes possible to easily and quickly inspect the bonded states of a plurality of land portions by which the rigid substrates and the flexible wiring board are electrically connected to each other by X-ray photographs obtained from taking an X-ray of the bonded states and it is possible to provide a circuit substrate having a simple arrangement which is highly reliable in the connected state of the connected portion.

The bonded states of a plurality of land portions can be easily and quickly inspected by taking an X-ray of the bonded states and a circuit substrate which is highly reliable in the connected state of the connected portion can be realized by a simple arrangement.

BRIEF DESCRIPTION OF THE DRAWINGS

FIGS. 2A and 2B show the circuit substrate shown in FIG. 1, wherein FIG. 2A is a front view showing the side of the first rigid substrate and FIG. 2B is a back view showing the side of the second rigid substrate;

FIGS. 3A and 3B show a flexible wiring board constructing a part of the circuit substrate shown in FIG. 1, wherein FIG. 3A is a front view of the first surface and FIG. 3B is a back view of the second surface;

FIGS. 8A and 8B are explanatory diagrams useful for explaining the mounting process of the circuit substrate shown in FIG. 1, wherein FIG. 8A is an explanatory diagram showing the state in which the first and second rigid substrates are located above and below the flexible wiring board before they are bonded and FIG. 8B is an explanatory diagram showing the state in which the first and second rigid substrates are located above and below the flexible wiring board after they were bonded;

FIG. 13 is a rear perspective view showing in a partly-cross-sectional fashion a main portion of a camera apparatus including the circuit substrate shown in FIG. 1;

DESCRIPTION OF THE PREFERRED EMBODIMENTS

Before describing the preferred embodiments of the present invention, the present invention may be summarized such that a circuit substrate in which bonded states of a plurality of land portions can be checked easily and quickly by a suitable method such as X-ray photographs and which is highly reliable in the connected states of the connection portions could be realized by a simple arrangement.

The embodiments of the present invention will be described below with reference to the accompanying drawings.

Figure 1:
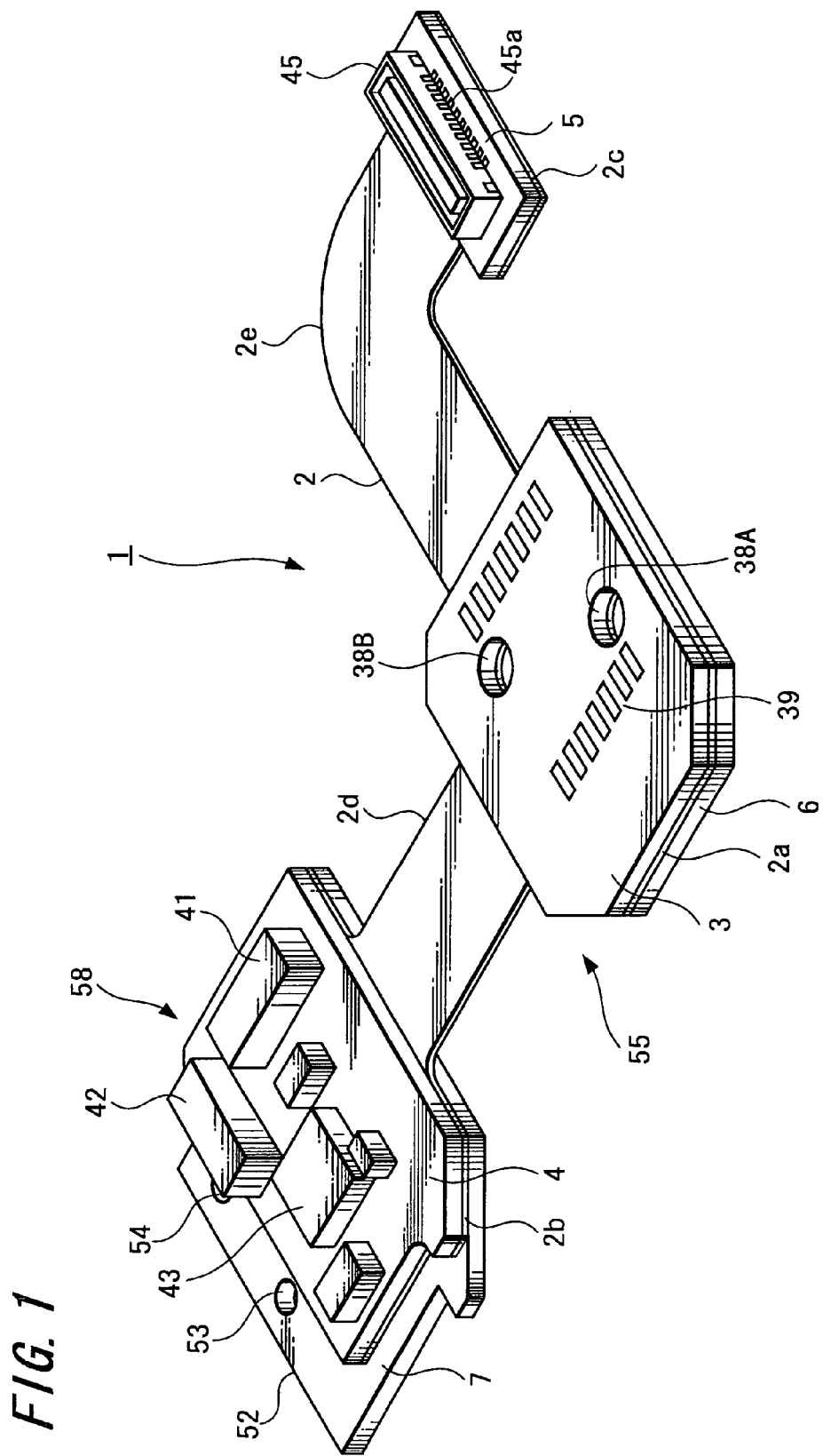
FIG. 1 is a perspective view of an external appearance showing a circuit substrate according to a first embodiment of the present invention, illustrating the surface side of the circuit substrate in which a first rigid substrate is seen from the surface, a second rigid substrate being seen from the back.
Figure 2:
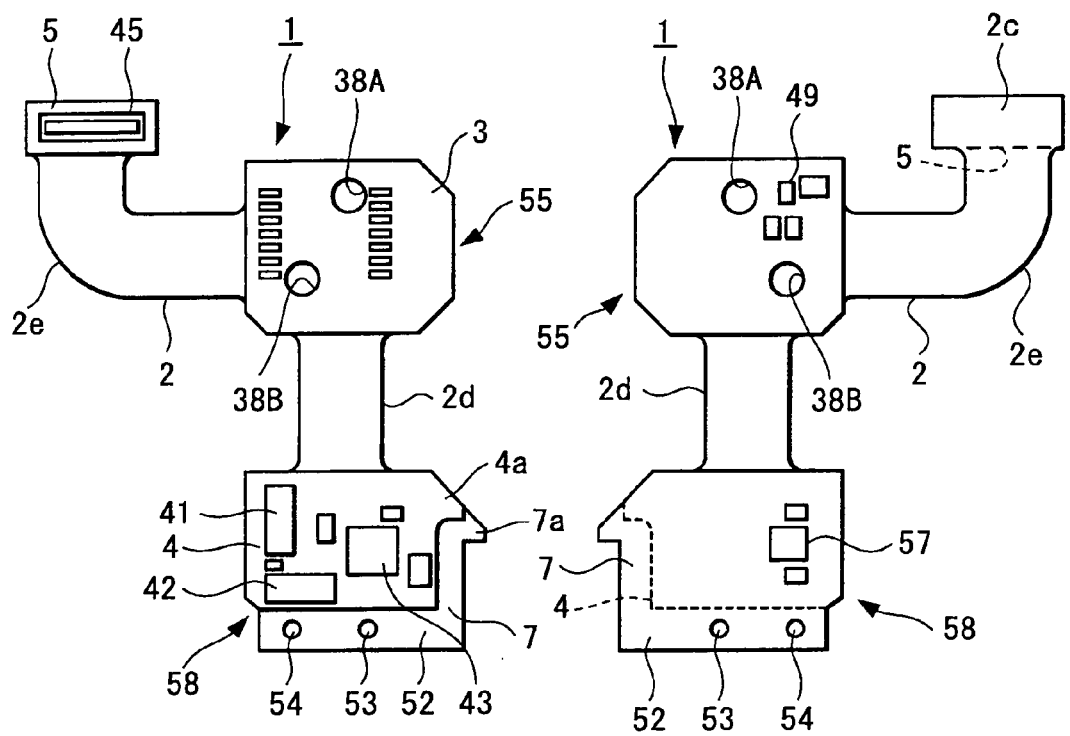
Figure 3:
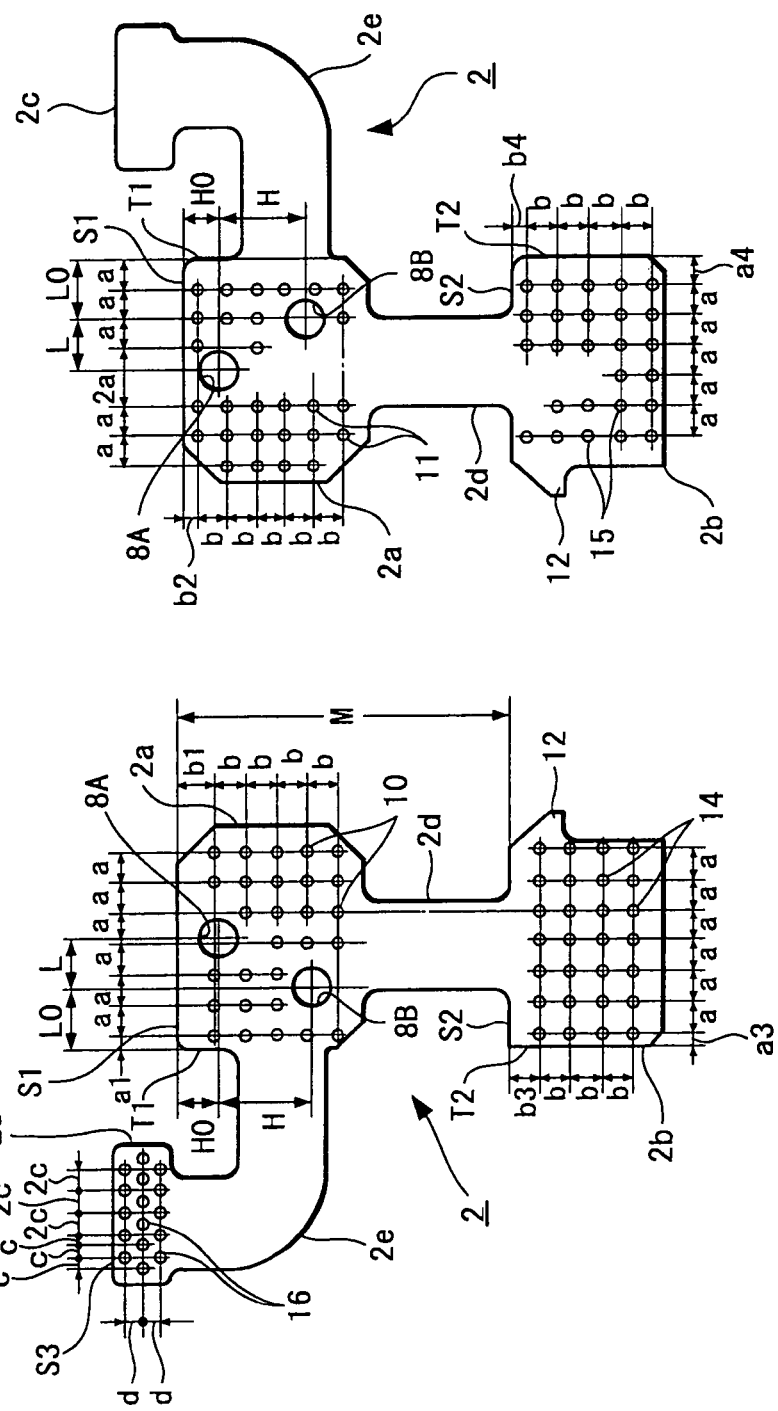
Figure 4:
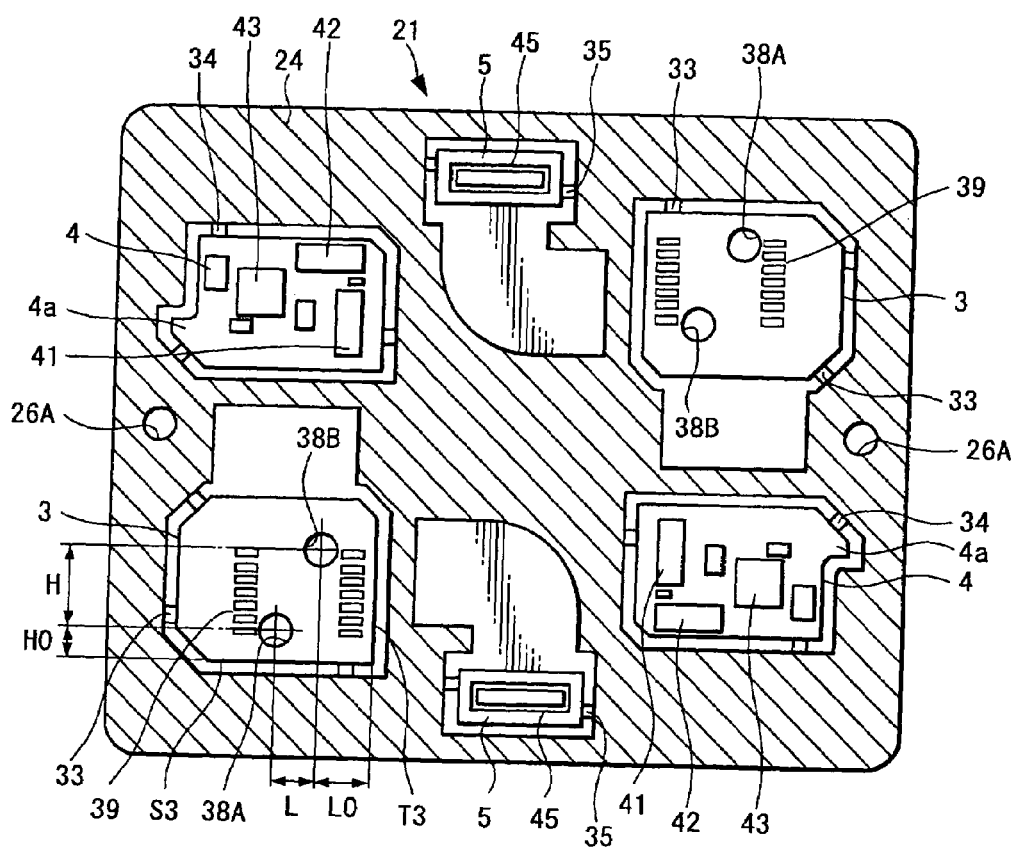
FIG. 4 is a front view showing a first printed wiring board in which two sets of the first rigid substrate and a third rigid substrate of two kinds constructing a part of the circuit substrate shown in FIG. 1 are integrally formed as one body.
Figure 5:
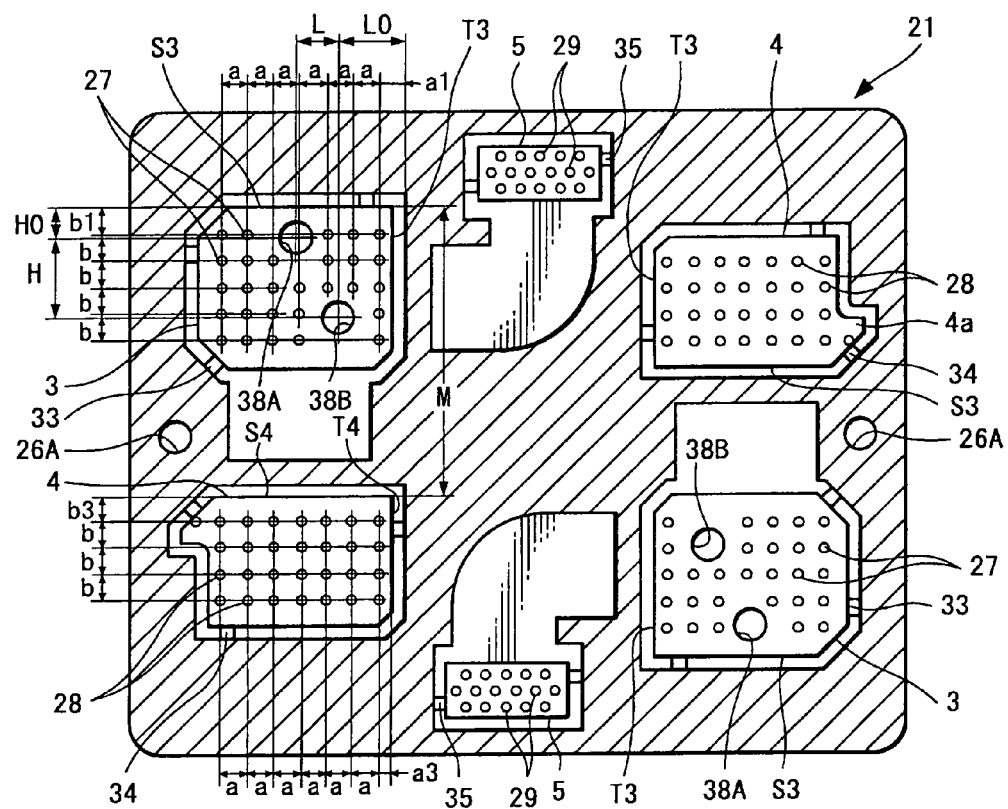
FIG. 5 is a back view of the first printed wiring board shown in FIG. 4.
Figure 6:
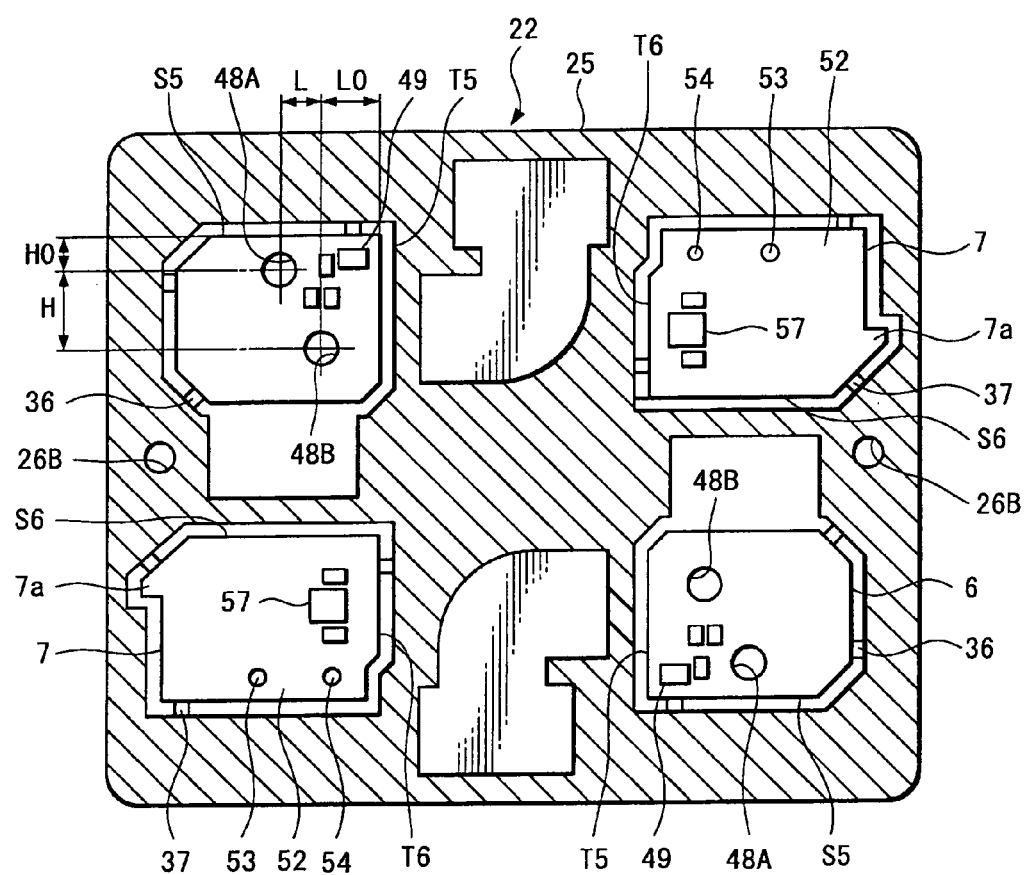
FIG. 6 is a surface view showing a second printed wiring board in which two sets of the second rigid substrates of two kinds constructing a part of the circuit substrate shown in FIG. 1 are integrally formed as one body.
Figure 7:
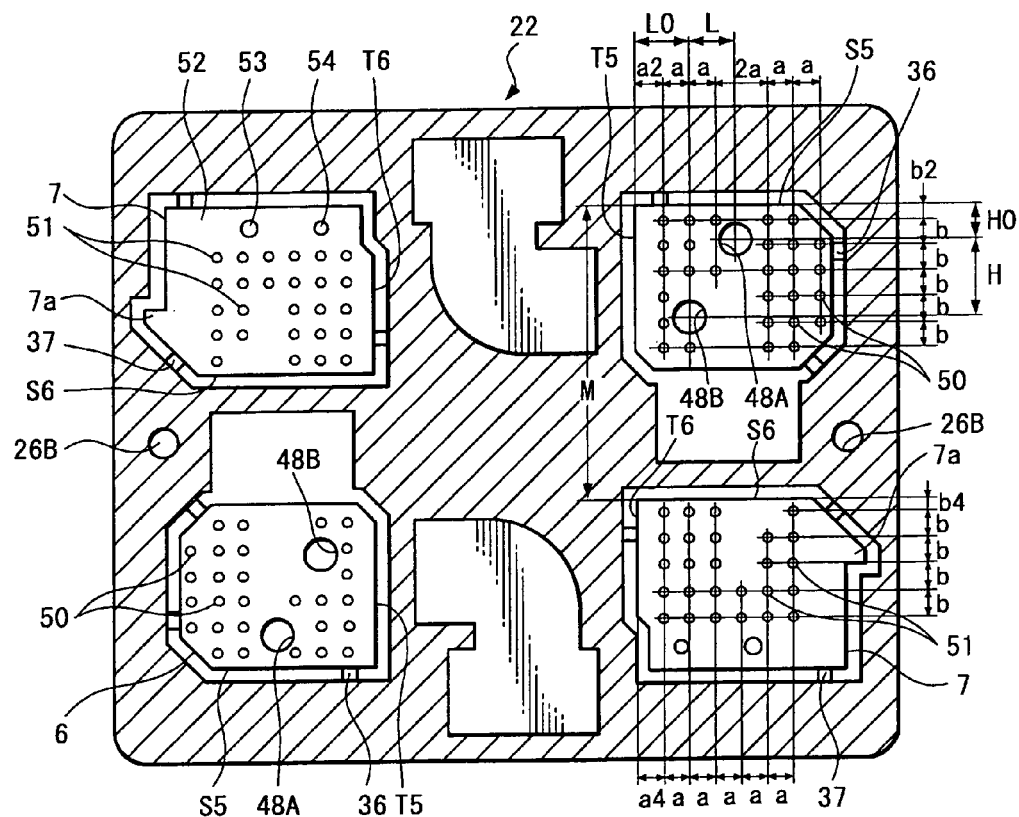
FIG. 7 is a back view of the second printed wiring board shown in FIG. 6.
Figure 8A:
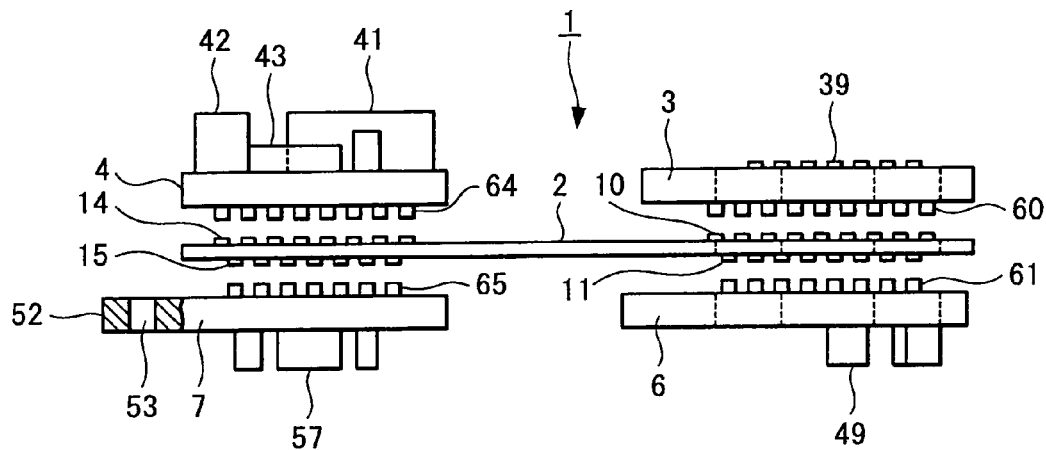
Figure 8B:
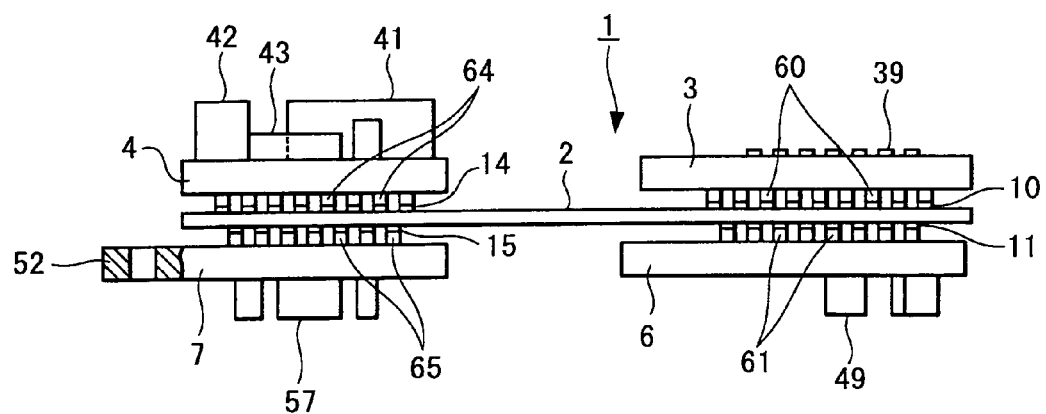
Figure 9:
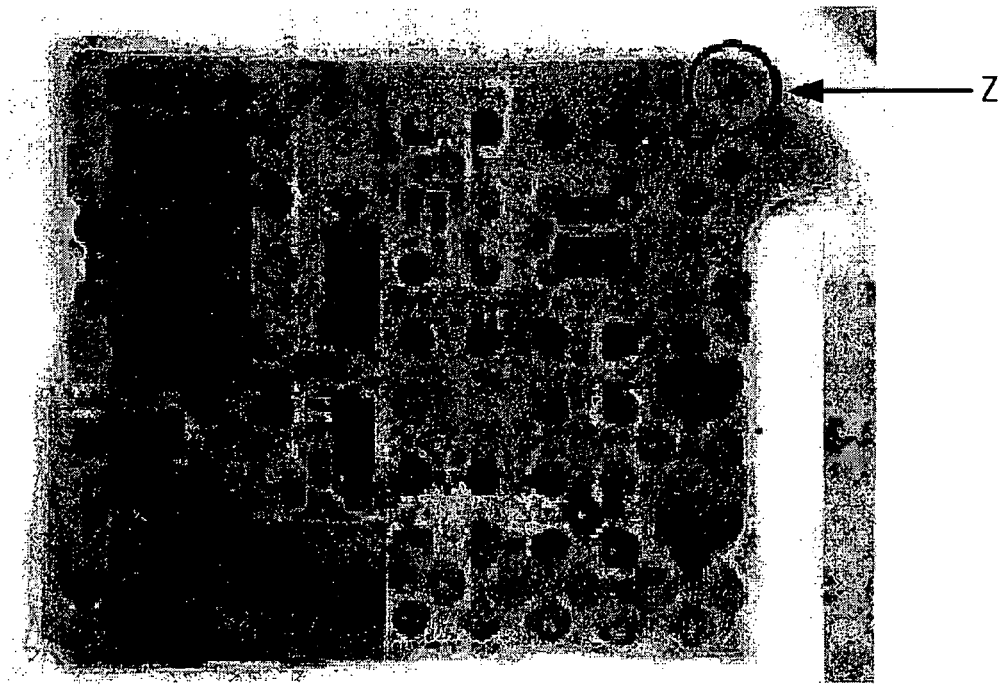
FIG. 9 is an X-ray photograph showing a second rigid flexible portion of a product in which the circuit substrate shown in FIG. 1 was manufactured.
Figure 10:
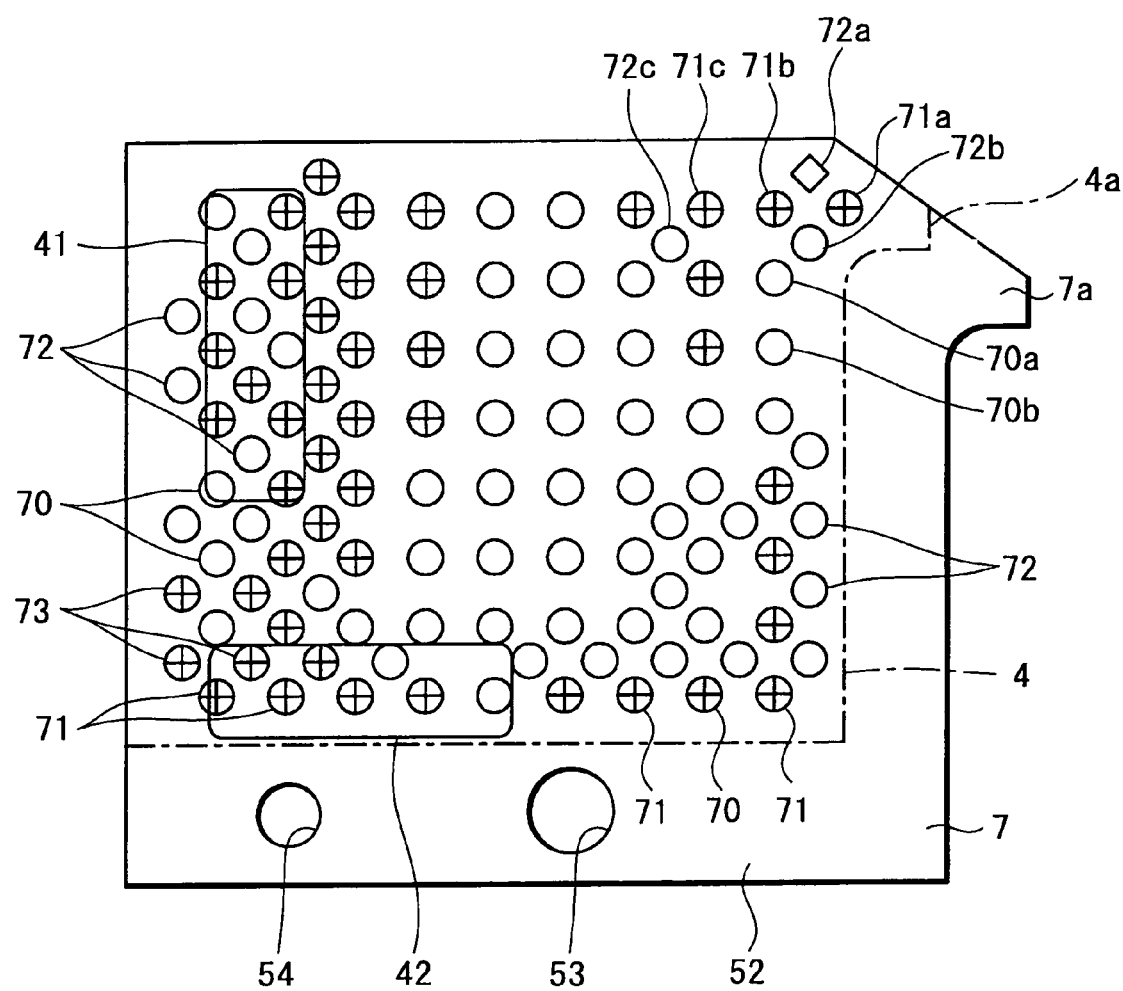
FIG. 10 is an explanatory diagram useful for explaining the contents of the X-ray photograph shown in FIG. 9.
Figure 11:
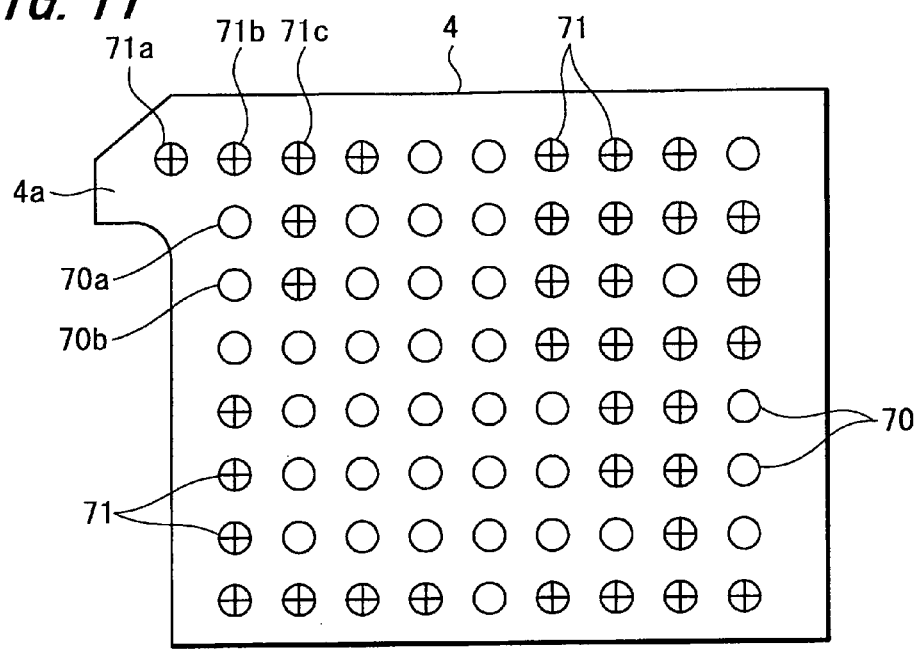
FIG. 11 is an explanatory diagram showing the second surface of the first rigid substrate used in FIG. 9.
Figure 12:
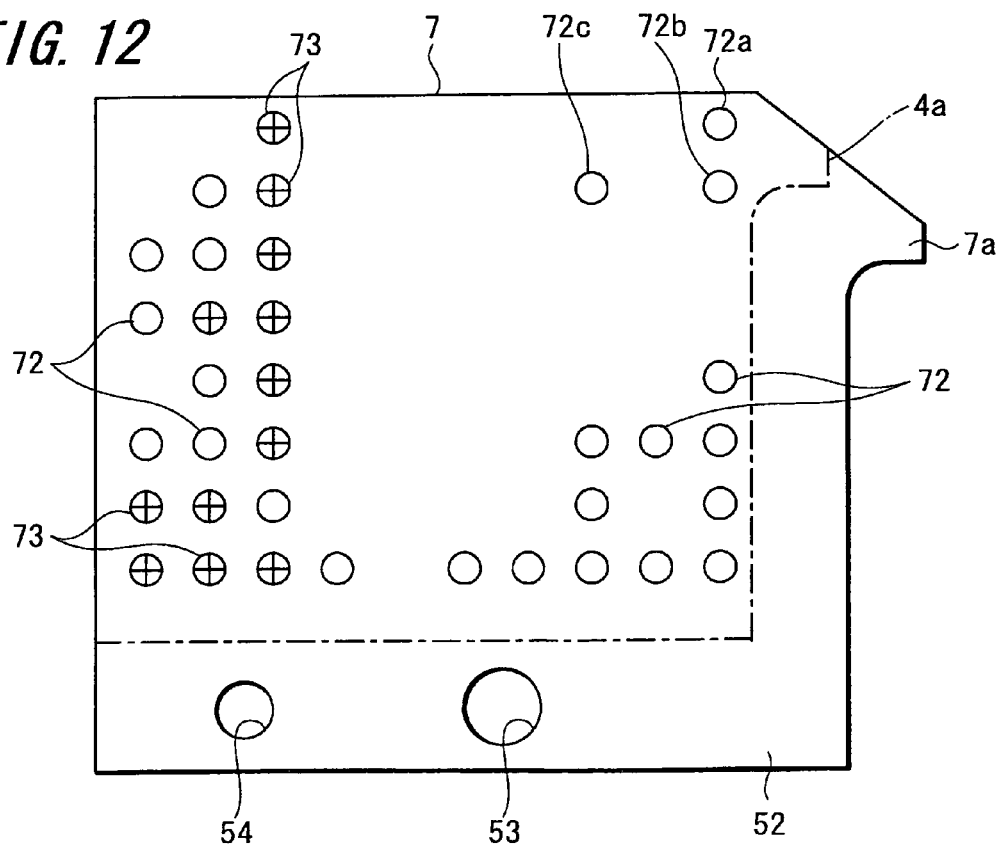
FIG. 12 is an explanatory diagram showing the second surface of the second rigid substrate used in FIG. 9.
Figure 13:
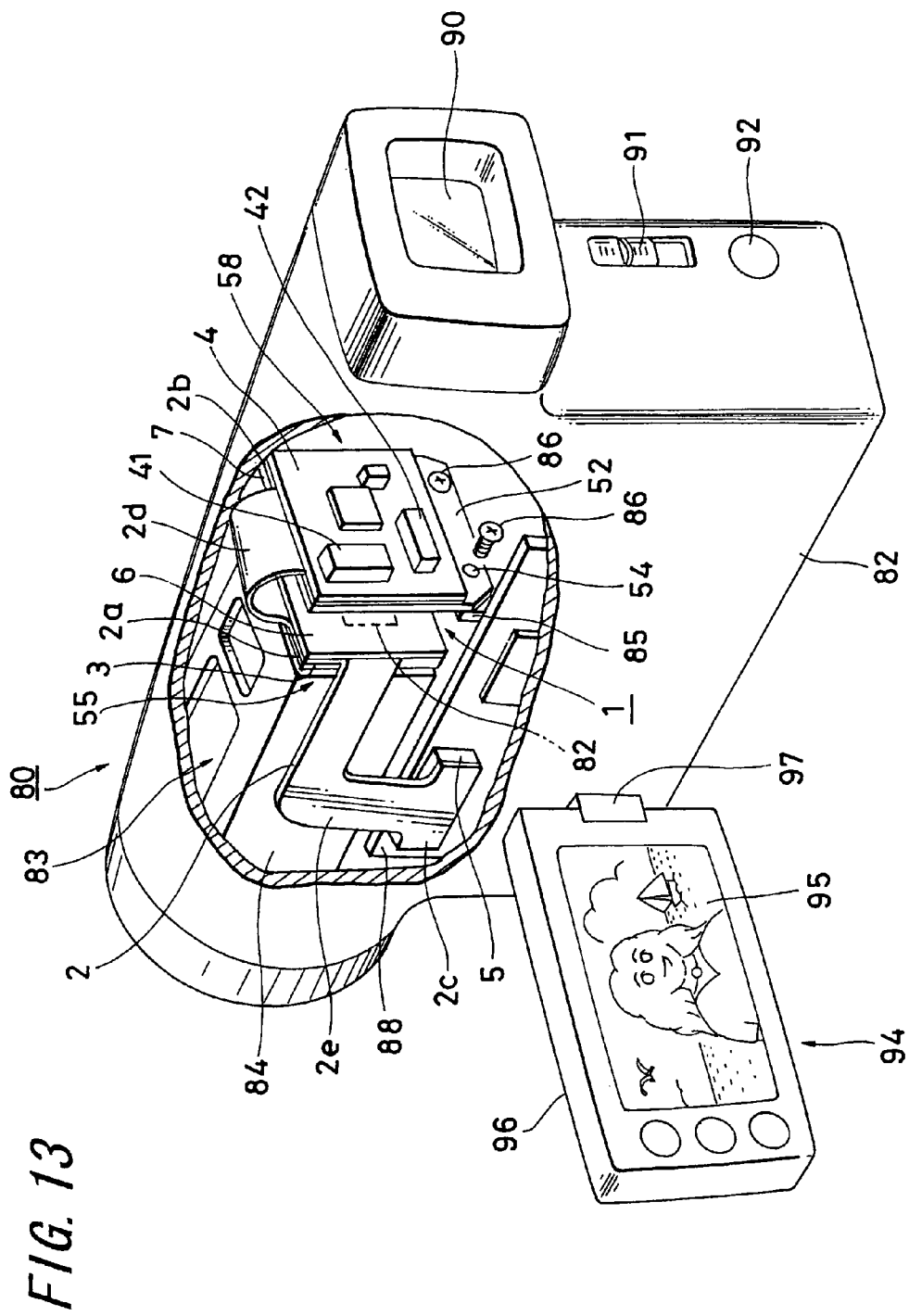
FIG. 13 is a diagram used to explain the state in which the circuit substrate shown in FIG. 1 is in use, more specifically.
Figure 14:
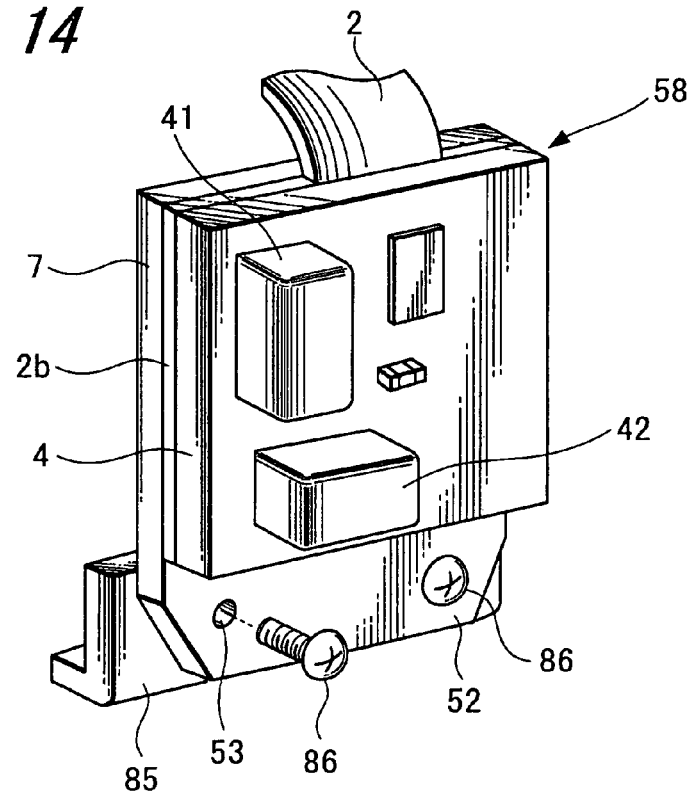
FIG. 14 is a diagram showing the second rigid flexible portion of the circuit substrate shown in FIG. 13 in an enlarged-scale.
Figure 15:
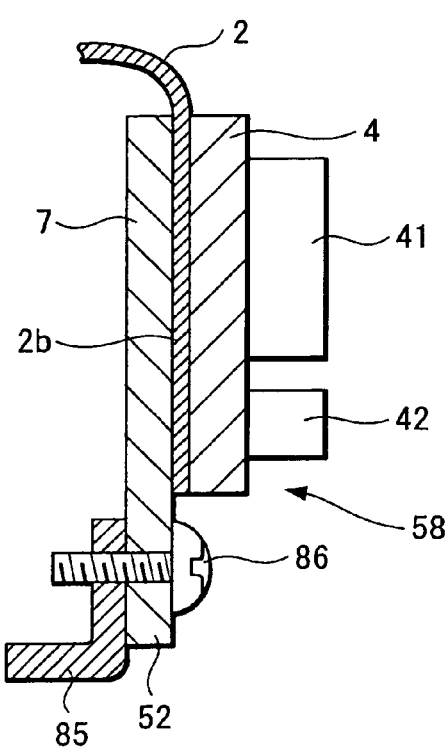
FIG. 15 is a longitudinal cross-sectional view of the second rigid flexible portion shown in FIG. 14.
Figure 16:
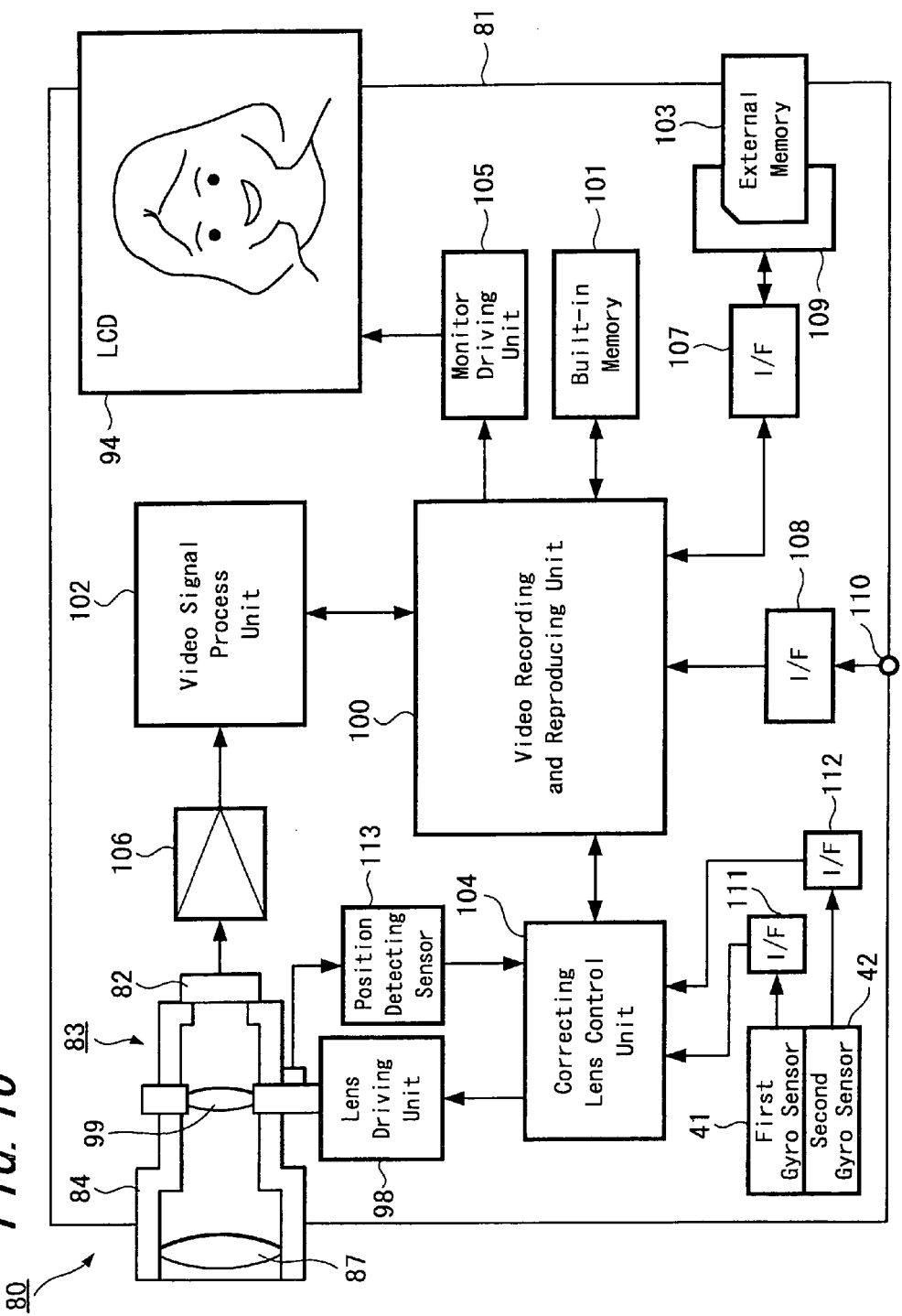
FIG. 16 is a block diagram showing a schematic arrangement of the camera apparatus shown in FIG. 13.

FIGS. 1 to 16 are diagrams used to explain the embodiments of the present invention. More specifically, FIG. 1 is a perspective view of an external appearance of a circuit substrate according to a first embodiment of the present invention. FIGS. 2A and 2B are a front view and a back view of the same circuit substrate, respectively. FIGS. 3A and 3B are a front view and a back view of a flexible wiring board, respectively. FIG. 4 is a front view of a first printed wiring board in which two kinds of first rigid substrates and third rigid substrates are integrally formed as one body. FIG. 5 is a back view of the same first printed wiring board. FIG. 6 is a front view of a second printed wiring board in which two kinds of second rigid substrates are integrally formed as one body. FIG. 7 is a back view of the same second printed wiring board. FIGS. 8A and 8B are explanatory diagrams showing the states obtained before and after the mounting process of the circuit substrate according to the present invention, respectively. FIG. 9 is an X-ray photograph showing a main portion of a manufactured product manufactured by using the circuit substrate according to the present invention. FIG. 10 is an explanatory diagram used to explain the contents of FIG. 9. FIG. 11 is an explanatory diagram showing the second surface of the first rigid substrate used in FIG. 9. FIG. 12 is an explanatory diagram showing the second surface of the second rigid substrate used in FIG. 9. FIG. 13 is an explanatory diagram showing in a partly-cross-sectional fashion a main portion of a camera apparatus and to which reference will be made in explaining the state in which the circuit substrate of the present invention is in use. FIG. 15 is a longitudinal cross-sectional view of FIG. 14 and FIG. 16 is a block diagram showing a schematic arrangement of the camera apparatus.

As shown in FIG. 1 and FIGS. 2A and 2B, a circuit substrate 1, shown as the first embodiment of the present invention, is what might be called a rigid flexible wiring board which is composed of a flexible wiring board 2, three rigid substrates 3, 4 and 5 fixed to one face of the flexible wiring board and two rigid substrates 6 and 7 fixed to the other face of the flexible wiring board 2. In the embodiments according to the present invention, the front and the back of the circuit substrate 1 are assumed in such a manner that the surface in which the first rigid substrates 3 and 4 of the flexible wiring board 2 are mounted on the circuit substrate are the front and that the opposite surface in which the second rigid substrates 6 and 7 are mounted on the circuit substrate 1 are the back. It is needless to say that a relationship between the front and the back can be reversed.

The flexible wiring board 2 is a wiring board on which a single layer of or a plurality of layers of electric wirings is formed in a two-dimensional fashion and in a three-dimensional fashion. This flexible wiring board 2 includes a conductive layer formed as a single layer or a plurality of layers by conductive metal such as copper and a coating layer formed by insulating plastic such as polyimide (PI) so as to coat the conductive layer. More specifically, substantially the whole surfaces of one surface (front) and the other surface of the conductive layer are covered with the coating layer. As shown in FIGS. 3A and 3B, this flexible wiring board 2 is composed of three substrate mounting portions 2a, 2b and 2c and two joint portions 2d and 2e which may join the adjacent substrate mounting portions 2a and 2b and the adjacent substrate mounting portions 2a and 2c.

The first substrate mounting portion 2a of the flexible wiring board 2 is substantially square and its dimension is 20 mm in length and 22 mm in width. An upper end edge of the first substrate mounting portion 2a is assumed to be a first upper reference portion S1, and one side end edge perpendicular to the first upper reference portion S1 is assumed to be a first horizontal reference portion T1. The first substrate mounting portion 2a has two positioning holes 8A and 8B to properly position the whole of the flexible wiring board including the first substrate mounting portion 2a in such a manner that the two positioning holes 8A and 8B are extended through the front and back of the first substrate mounting portion 2A.

The two positioning holes 8A and 8B are formed on the first substrate mounting portion 2A with a distance L in the left and right (horizontal) directions in which the first upper reference portion S1 is extended. Also, the two positioning holes 8A and 8b are formed on the first substrate mounting portion 2A with a distance H in the upper and lower (longitudinal) direction in which the first horizontal reference portion T1 is extended. Further, the first positioning hole 8A is formed on the first substrate mounting portion 2a with a distance H0 from the first upper reference portion S1 and with a distance L0+L from the first longitudinal reference portion T1. Also, the second positioning hole 8B is formed on the first substrate mounting portion 2a with a distance H0+H from the first upper reference portion S1 and with a distance L0 from the first longitudinal reference portion T1. A plurality of land holes 10 and 11 are extended through the first surface serving as the front side of the first substrate mounting portion 2a and the second surface serving as the back side thereof so as to expose a part of the inside conductive layer.

A plurality of land holes 10 and 11 are formed over substantially the whole surfaces of the first and second surfaces of the first substrate mounting portion 2a with nearly an equal interval in a lattice fashion. More specifically, a plurality of land holes 10 and a plurality of land holes 11 have substantially similar layouts and arrangements so that they are spaced apart from each other by a distance a in the horizontal direction in which the first upper reference portion S1 is extended and that they are spaced apart from each other by a distance b in the direction in which the first horizontal reference portion T1 is extended. These distances a and b are set to be equal (distance a=b) in this embodiment and they are 2 mm, for example.

On the other hand, a plurality of first land holes 10 formed on the first surface of the first substrate mounting portion 2a and a plurality of second land holes 11 formed on the second surface are located in such a manner that they may not be placed one upon another. More specifically, according to this embodiment of the present invention, the land holes 10 and the land holes 11 are located in such a manner that the second land holes 11 (or the first land holes 10) are located at substantially the central portions of the four first land holes 10 (or the second land holes 11) located at four corner portions so as to form a square.

For example, assuming now that a distance from the first upper reference portion S1 to the leading first land hole 10 in the first surface is b1, a distance from the first horizontal reference portion T1 to the leading first land hole 10 is a1, a distance from the first upper reference portion S1 to the leading first second land hole 11 is b2 in the second surface and that a distance from the first horizontal reference portion T1 to the leading second land hole 11 is a2, then the distance a1 is 1 mm, the distance b1 is 2 mm, the distance a2 is 2 mm and the distance b2 is 1 mm, respectively.

Also, one end of the first joint portion 2d is connected to the side opposite to the first upper reference portion S1 of the first substrate mounting portion 2a. The first joint portion 2d has a width approximately half of the length of the horizontal direction of the first substrate mounting portion 2a and it is connected to substantially the central portion of the first upper reference portion S1. The second substrate mounting portion 2b is connected to the other end (lower end) of the upper and lower direction which is the longitudinal direction of the first joint portion 2d.

The second substrate mounting portion 2b is substantially square and its dimension is 18 mm in length and 20 mm in width, for example. The upper end edge of the second substrate mounting portion 2b is assumed to be a second upper reference portion S2 and one side end edge perpendicular to the second upper reference portion S2 is assumed to be a second horizontal reference portion T2. The second upper reference portion S2 is set to be spaced apart from the first upper reference portion S1 by a distance M in the upper and lower direction. Also, a hook-like projected portion 12 projecting in the lateral side is provided on the side opposite to the second horizontal reference portion T2 of the second substrate mounting portion 2b. The hook-like projected portion 12 has an inclined surface portion inclined toward the side of the first substrate mounting portion 2a.

This second substrate mounting portion 2b also has a plurality of land holes 14 and 15 formed on its first surface serving as the front side and its second surface serving as the back side so as to extend through the coating layer to expose a part of the inside conductive layer. A plurality of land holes 14 and 15 are bored through substantially the whole surfaces of the first and second surfaces of the second substrate mounting portion 2b at substantially equal interval in a lattice fashion.

A plurality of land holes 14 and 15 have nearly similar layouts and arrangements so that they are provided with a distance a in the horizontal direction in which the second upper reference portion S2 is extended and that they are provided with a distance b in the longitudinal direction in which the second horizontal reference portion T2 is extended. In this embodiment, these distances a and b are set to be equal length (distance a=b) and this length is 2 mm, for example. On the other hand, a plurality of first land holes 14 bored on the first surface and a plurality of second land holes 15 bored on the second surface are located so as not to be placed one upon another.

More specifically, according to this embodiment, the first land holes 14 and the second land holes 25 are located in such a fashion that the second land holes 15 (or first land holes 14) may be respectively placed at substantially the central portions of the four first land holes 14 (or second land holes 15) located at four corners so as to form a square. For example, assuming now that b3 represents a distance from the second upper reference portion S2 to the leading first land hole 14, a3 represents a distance from the second horizontal reference portion T2 to the leading first land hole 14 in the first surface, b4 represents a distance from the second horizontal reference portion T2 to the leading second land hole 15 and that a4 represents a distance from the second horizontal reference portion T2 to the leading second land hole 15 in the second surface, then the distance a3 is 1 mm, the distance b3 is 2 mm and also the distance a4 is 2 mm and the distance b4 is 1 mm, respectively.

One end of the second joint portion 2e is joined to the first substrate mounting portion 2a at its side opposing the first horizontal reference portion T1. A width of the second joint portion 2e is set to be approximately half of the length of the longitudinal direction of the first substrate mounting portion 2a and the second joint portion 2e is continued to the first upper reference portion S1 at the side slightly lower than its central portion. This second joint portion 2e is curved substantially 90 degrees at its intermediate portion of the longitudinal direction and the third substrate mounting portion 2c is continued to the upper end which is the other end of the second joint portion 2e. The third substrate mounting portion 2c is rectangular and it is 6 mm in length and 18 mm in width. The third substrate mounting portion 2c has a plurality of land holes formed at its first surface serving as the front side so as to extend through the coating layer to expose a part of the inside conductive layer.

A plurality of land holes 16 are bored on substantially the whole surface of the first surface of the third substrate mounting portion 2c at approximately equal interval in a checkered fashion. More specifically, a plurality of land holes 16 is arrayed in a plurality of columns with a distance c in the horizontal direction and they are also arrayed in a plurality of columns with a distance d in the longitudinal direction. In this embodiment, the adjacent three land holes 16 are located so as to form substantially a regular triangle. The distance c, for example, is 0.7 mm and the distance d is 1.2 mm.

The three rigid substrates 3, 4 and 5 are mounted on the first surface of the flexible wiring board 2 having the above-mentioned arrangement and the two rigid substrates 6 and 7 are mounted on the second surface opposite to the first surface. It is preferable that the three rigid substrates 3, 4 and 5 should be integrally formed with one first printed circuit wiring board 21 as one body as shown in FIGS. 4 and 5, for example. Also, in a like manner, it is preferable that the two rigid substrates 6 and 7 should be integrally formed with one second printed circuit wiring board 22 as shown in FIGS. 6 and 7, for example.

The first and second printed circuit wiring boards 21 and 22 include a first base member 24 and a second base member 25 formed of rectangular plate bodies which are equal to each other in size. The base members 24 and 25 have two positioning holes 26A and 26B formed thereon to properly position the base members 24 and 25 at predetermined positions of manufacturing jigs when the circuit substrate 1 is manufactured. The two positioning holes 26A and 26B are set at the identical positions so that the assembly work can be carried out regardless of which of the base members 24 and 25 is taken as a reference base member.

The first printed circuit wiring board 21 is constructed such that two sets of rigid substrate group formed of a combination of the two first rigid substrates 3 and 4 and one third rigid substrate 5 may be formed on one base member 24. Also, the second printed circuit wiring board 22 is constructed such that two sets of rigid substrate group formed of a combination of the two second rigid substrates 6 and 7 may be formed on one base member 25. In order to obtain the same state as that obtained after assembly shown in FIG. 2A, two sets of rigid substrates 3, 4 and 5, that is, six rigid substrates 3, 4 and 5 are formed at predetermined positions of the first printed circuit wiring board 21 with the same shape such that they may be located in a point of symmetry fashion with respect to the central portion of the first base member 24. Similarly, in order to obtain the same state as that obtained after assembly shown in FIG. 2B, two sets of rigid substrates 6 and 7, that is, four rigid substrates 6 and 7 are formed at predetermined positions of the second printed circuit wiring board 22 with the same shape such that they may be located in a point of symmetry fashion with respect to the central portion of the second base member 25.

As shown in FIG. 4 and 5, in the first printed circuit wiring board 21, the third rigid substrate 5 of the first set is located on the upper portion of the center of the first base member 24. Concurrently therewith, the third rigid substrate 5 of the second set is located on the lower portion of the center of the first base member 24. Then, the first rigid first substrate 3, which shows a specific example of the first rigid substrate of the first set, and the first rigid second substrate 4, which shows a second specific example of the first rigid substrate, are arrayed on the right side portion of the first base member 24 in the longitudinal direction. Concurrently therewith, the first rigid first substrate 3 and the first rigid second substrate 4 are arrayed at the left side portion of the first base member 24 in the longitudinal direction.

The two sets of the first rigid first substrate 3 and the first rigid second substrate 4 are located upside-down in the right and left direction and two sets, that is, six rigid substrates 3, 4 and 5 in total are located on the first base member 24 symmetrically with respect to the central portion of the first base member 24 in a point of symmetry fashion. Thus, when the first printed circuit wiring board 21 is rotated 180 degrees in its plane direction, the three rigid substrates 3, 4 and 5 of the first set may be moved to the identical positions of the second set and the three rigid substrates 3, 4 and 5 of the second set may be moved to the identical positions of the first set.

Also, in the second printed circuit wiring board 22, the two sets of the second rigid substrates 6 and 7 are located at both of the right and left sides of the second base member 25 in a point of symmetry fashion. More specifically, on the right side portion of the second base portion 25, the second rigid first substrate 6 which shows a first specific example of the second substrate and the second rigid second substrate 7 which shows a second specific example of the second rigid substrate are arrayed from the upper to lower direction in the longitudinal direction. The second set of two rigid substrates 6 and 7 are arrayed relative to this first set of the two rigid substrates 6 and 7 from the lower to upper direction in the longitudinal direction. Since these rigid substrates 6 and 7 are located in a point of symmetry fashion, when the second printed circuit wiring board 22 is rotated 180 degrees in its plane direction, the first set of the two rigid substrates 6 and 7 are moved to the identical positions of the second set and the second set of the two rigid substrates 6 and 7 are moved to the identical positions of the first set.

These five kinds of rigid substrates 3 to 7 are multilayer printed circuit wiring boards in which a rigid plate material made of plastics made of glass fiber and epoxy resin (generally referred to as a "glass epoxy" and abbreviated as a "GF/EP·FRP") and a thin flexible plate material made of polyimide (PI) are laminated each other on which a single layer of wiring pattern or a plurality of layers of wiring patterns made of a suitable conductive metal such as copper may be formed. The respective rigid substrates 3 to 7 can be manufactured when they are cut from predetermined positions of the first base member 24 or the second base member 25 so as to have predetermined shapes.

As shown in FIGS. 4 to 6, wiring patterns formed of conductive layers with predetermined shapes are respectively provided on the first base member 24 and the second base member 25 at their predetermined positions of the first surface (surface) and the second surface (back) in the portions in which the above-described rigid substrates 3 to 7 are provided. Electronic parts required by the respective rigid substrates 3 to 7 are respectively mounted on the first surfaces of these rigid substrates 3 to 7 and they are electrically connected to their wiring patterns. Then, the rest of other portions of the first surfaces of the respective rigid substrates 3 to 7 are covered with insulating coating layers.

In the respective rigid substrates 3 to 7, the wiring pattern of the first surface and the wiring pattern of the second surface are electrically connected together at predetermined positions by using a plurality of through-holes which extend their surfaces and backs. However, a method for electrically connecting the wiring patterns of the front and back is not limited to the through-hole method (that is, copper through-hole plating method) of this embodiment and other suitable methods such as a paste filling method and a solder connecting method can be applied to the above-mentioned method.

Also, coating layers which may coat substantially the wholes surface are respectively provided on the respective second surfaces of the respective rigid substrates 3 to 7. The coating layers which may coat these second surfaces have bored thereon a plurality of land holes 27, 28, 29, 30 and 31 which are used to electrically connect the respective second surfaces to the wiring pattern of the above-described flexible wiring board 2. Then, when slit grooves are provided at predetermined positions of the first base member 24 and the second base member 25 so as to surround the circumferences except a plurality of bridging pieces 33 to 37, the five kinds of rigid substrates 3 to 7 having predetermined shapes can be manufactured.

As shown in FIGS. 4 and 5, the first rigid first substrate 3 is shaped like the first substrate mounting portion 2a of the flexible wiring board 2 and it is substantially a square which is 20 mm in length and 22 mm in width. An upper end edge of this first rigid first substrate 3 is used as the upper reference portion S3 and one side end edge perpendicular to this third upper reference portion S3 is used as the third horizontal reference portion T3.

This first rigid first substrate 3 has two positioning holes 38A and 38B extended through the front and the back in order to properly position it and the second rigid first substrate 6 through the flexible wiring board 2. The two positioning holes 38A and 38B are provided with a distance L in the direction in which the third upper reference portion S3 is extended and they are also provided with a distance H in the direction in which the third horizontal reference portion T3 is extended. Then, the first positioning hole 38A is set to the position distant from the upper reference portion S3 with a distance H0 in the longitudinal direction and the second positioning hole 38B is set to the position distant from the horizontal reference portion T3 with a distance L0 in the horizontal direction.

A terminal portion 39 to mount electronic parts such as a CCD (charge-coupled device) is provided on the first surface that serves as the surface of this first rigid first substrate 3. The terminal portion 39 include a plurality of terminal pieces arrayed in two rows, whereby the electronic parts such as the CCD can be electrically connected to the terminal portion 39. Also, as shown in FIG. 5, the second surface which serves as the back of the first rigid first substrate 3 has a plurality of land holes 27 extended through the coating layer to expose a part of the inside conductive layer.

A plurality of land holes 27 are located at the positions opposing a plurality of land holes 10 bored on the first surface of the first substrate mounting portion 2a at the same interval. More specifically, a plurality of land holes 27 are bored at a distance a in the horizontal direction in which the third upper reference portion S3 is extended and they are bored at a distance b in the longitudinal direction in which the third horizontal reference portion T3 is extended. These distances a and b are set to the equal length (distance a=b) in this embodiment and this equal length is 2 mm, for example. Then, the land hole 27 of the first row is set to the position distant from the upper reference portion S3 with a distance b1 in the longitudinal direction. Also, the land hole 27 of the first row is set to the position distant from the horizontal reference portion T3 with a distance a1 in the horizontal direction.

The first rigid first substrate 3 having the above-mentioned arrangement is supported to the first base member 24 by the three bridging pieces 33. The three bridging pieces 33 may be formed by removing three portions of the slits surrounding the circumference of the first rigid first substrate 3 and they are located so as to support the first rigid first substrate 3 to the first base member 24 from the three directions.

After that, the two positioning holes 38A and 38B of the first rigid first substrate 3 are in agreement with the two positioning holes 8A and 8B of the flexible wiring board 2 and thereby they are placed one upon another, whereby the first rigid first substrate 3 can be properly positioned to the first substrate mounting portion 2a. As a result, the respective land holes 27 of the first rigid first substrate 3 can be accurately placed on the land holes 10 of the first surface of the first substrate mounting portion 2a.

Similarly, as shown in FIGS. 4 and 5, the first rigid second substrate 4 is shaped like the second substrate mounting portion 2b of the flexible wiring board 2 and it is substantially a square with the hook-like projected portion 4a which is 18 mm in height and 20 mm in width. An upper end edge of the first rigid second substrate 4 is used as the fourth upper reference portion S4 and one side end edge perpendicular to this fourth upper reference portion S4 is used as the fourth horizontal reference portion T4.

A large number of electronic devices and electronic parts are mounted on the first surface that serves as the surface of the first rigid second substrate 4 and there is no space to provide positioning holes. For this reason, the first rigid second substrate 4 is not able to afford the positioning holes provided on the first rigid first substrate 3. Two gyro sensors 41 and 42, a microcomputer 43 and other electronic parts are mounted on the first surface of the first rigid second substrate 4. These gyro sensors 41, 42 and other devices and electronic parts can be electrically connected to predetermined portions of the wiring patterns by through-holes formed at predetermined positions.

The two gyro sensors 41 and 42 can be applied to attitude detection sensors of an electronic still camera, which will be described later on, showing a specific example of a camera apparatus using this circuit substrate 1. For example, the first gyro sensor 41 is adapted to detect an amount of displacement of a first direction (direction perpendicular to the optical axis of the lens apparatus) X applied to the camera body of the electronic still camera due to camera-shake and the like. The gyro sensor 42 is adapted to detect an amount of displacement of a second direction (direction perpendicular to the optical axis of the lens apparatus and which direction is also perpendicular to the first direction X) Y applied to the camera body of the electronic still camera due to camera-shake and the like. While the two gyro sensors 41 and 42 are provided in order to separately detect the displacement amount of the first direction X and the displacement amount of the second direction Y in the above-described embodiments, the present invention is not limited thereto and it is needless to say that the displacement amounts of the two directions of the first direction X and the second direction Y can be detected by one gyro sensor.

Also, as shown in FIG. 5, the second surface that serves as the back of the first rigid second substrate 4 has a plurality of land holes 28 extended through the coating layer to expose a part of the inside conductive layer. A plurality of land holes 28 are located at the positions opposing a plurality of land holes 15 provided on the first surface of the second substrate mounting portion 2b of the flexible wiring board 2 at the same interval. More specifically, a plurality of land holes 28 are provided with a distance a in the horizontal direction in which the fourth upper reference portion S4 is extended and they are also provided with a distance b in the longitudinal direction in which the fourth horizontal reference portion T4 is extended.

These distances a and b are set to the equal length (distance a=b) as mentioned hereinbefore and they are 2 mm, for example. Then, the land hole 28 of the first row from the upper direction is set to the position distant from the upper reference portion S4 with a distance b3 in the longitudinal direction. The land hole 28 of the first row from the left direction is set to the position from the horizontal reference portion T4 with a distance a3 in the horizontal direction. When the first rigid second substrate 4 is properly positioned to the second substrate mounting portion 2b, the upper reference portion S4 may be made identical to the upper reference portion S2 of the second substrate mounting portion 2b and the horizontal reference portion T4 may be made identical to the horizontal reference portion T2 of the second substrate mounting portion 2b.

The first rigid second substrate 4 having the above-mentioned arrangement may be supported to the first base member 24 by three bridging pieces 34. The three bridging pieces 34 can be formed by removing three portions of slits surrounding the circumference of the first rigid second substrate 4 and they are located so as to support the first rigid second substrate 4 from the three directions.

As described above, the first rigid second substrate 4 is placed on the second substrate mounting portion 2b of the flexible wiring board 2 in such a manner that the upper reference portions S2 and S4 and the horizontal reference portions T2 and T4 may become identical to each other. As a consequence, a plurality of land holes 28 of the first rigid second substrate 4 can be properly placed on a plurality of land holes 14 of the second substrate mounting portion 2b, respectively. Hence, both of the land holes 14 and 28 can be placed one upon another accurately.

As shown in FIGS. 4 and 5, the third rigid substrate 5 is shaped like the third substrate mounting portion 2c of the flexible wiring board 2 and it is a rectangular which is 6 mm in length and 18 mm in width, for example. A connector 45 to electrically connect the third rigid substrate 5 to other suitable device such as electronic devices is mounted on the first surface serving as the surface side of the third rigid substrate 5. The connector 45 includes a rectangular frame body slightly smaller than the third rigid substrate 5 and a plurality of connection terminals 45a is provided along the long side of the frame body of the connector 45. A plurality of connection terminals 45a may be connected electrically to the wiring pattern of the third substrate mounting portion 2c by a plurality of through-holes through a plurality of land holes 16.

The third rigid substrate 5 having the above-mentioned arrangement is supported to the first base member 24 by two bridging pieces 35. The two bridging pieces 35 may be formed by removing two portions of slits surrounding the circumference of the third rigid substrate 5 and they are located in such a manner as to support the third rigid substrate 5 to the first base member 24 from right and left direction.

As shown in FIGS. 6 and 7, the second rigid first substrate 6 is shaped like the substrate symmetrical with respect to the first substrate mounting portion 2a of the flexible wiring board 2 and the first rigid first substrate 3 and it is substantially a square which is 20 mm in length and 22 mm in width. An upper end edge of this second rigid first substrate 6 is used as the fifth upper reference portion S5 and one side end edge perpendicular to this fifth upper reference portion S5 is used as the fifth horizontal reference portion T5.

This second rigid first substrate 6 has two positioning holes 48A and 48B extended through the front and back to properly place it and the first rigid first substrate 3 which are placed upon one another through the flexible wiring board 2. The two positioning holes 48A and 48B are provided at a distance L in the horizontal direction in which the fifth upper reference portion S5 is extended and they are also provided at a distance H in the longitudinal direction in which the fifth horizontal reference portion T5 is extended. Then, the first positioning hole 48A is set to the position distant from the upper reference portion S5 with a distance H0 in the longitudinal direction. Also, the second positioning hole 48B is set to the position distant from horizontal reference portion T5 with a distance L0 in the horizontal direction.

A plurality of electronic parts 49 such as resistors and capacitors may be mounted on the first surface that serves as the surface of this second rigid first substrate 6. These electronic parts 49 can be electrically connected to the predetermined portions of the wiring pattern by through-holes bored at predetermined positions. Also, as shown in FIG. 7, the second surface which serves as the back of the second rigid first substrate 6 has a plurality of land holes 50 extended through the coating layer to expose a part of the inside conductive layer.

A plurality of land holes 50 may be located at the positions corresponding to a plurality of land holes 11 bored on the second surface of the first substrate mounting portion 2a at the same interval. More specifically, a plurality of land holes 50 may be located with a distance a in the horizontal direction in which the fifth upper substrate portion S5 is extended. Also, the land holes 50 may be located with a distance b in the longitudinal direction in which the fifth horizontal reference portion T5 is extended. These distances a and b are set to an equal length (distance a=b) in this embodiment and this distance is 2 mm, for example. Then, the land hole 50 of the first row is set to the position distant from the upper reference portion S5 with a distance b1 to the longitudinal direction. Also, the land hole 50 of the first row is set to the position distant from the horizontal reference portion T5 with a distance a1 to the horizontal direction.

The second rigid first substrate 6 having the above-mentioned arrangement is supported to the second base member 25 by three bridging pieces 36. The three bridging pieces 36 may be formed by removing three portions of the slits surrounding the circumference of the second rigid first substrate 6 and they are located in such a manner as to support the second rigid first substrate 6 from the three directions.

Consequently, the two positioning holes 48A and 48B of the second rigid first substrate 6 may be accurately placed on the two positioning holes 38A and 38B of the first rigid first substrate 3 through the two positioning holes 8A and 8B of the flexible wiring board 2, whereby the two positioning holes 48A and 48B of the second rigid first substrate 6 can be properly positioned to the two positioning holes 38A and 38B of the first rigid first substrate 3. As a result, the respective land holes of the second rigid first substrate 6 can be placed on the respective land holes 11 of the second surface of the first substrate mounting portion 2a. A first rigid flexible portion 55 may be constructed by the first rigid first substrate 3, the first substrate mounting portion 2a and the second rigid first substrate 6 which are laminated with each other in a three-layer fashion and of which predetermined portions are electrically bonded together by a suitable method such as through-holes and soldering.

Also, as shown in FIGS. 6 and 7, the second rigid second substrate 7 is shaped slightly larger than the second substrate mounting portion 2b of the flexible wiring board 2 and the first rigid second substrate 4 and it is shaped like substantially a square with a hook-like projected portion 7a which is 23 mm in length and 23 mm in width. An upper end edge of this second rigid second substrate 7 is used as the sixth upper reference portion S6 and one side end edge perpendicular to this sixth upper reference portion S6 is used as the sixth horizontal reference portion T6.

This second rigid second substrate 7 is extended to the opposite sides of the sixth upper reference portion S6 and the sixth horizontal reference portion T6 and hence it is formed to be large in size. More specifically, the second rigid second substrate 7 has one side extended to the side of the hook-like projected portion 7a opposite to the sixth horizontal reference portion T6 and it is shaped in such a manner that the hook-like projected portion 4a of the first rigid second substrate 4 may be accommodated within the hook-like projected portion 7a. Also, the second rigid second substrate 7 may be projected to the side opposite to the sixth upper reference portion S6 to thereby form a fixed portion 52 by which the second rigid second substrate 7 and the like can be fixed to predetermined positions, places and the like (for example, frame, mechanical chassis of camera body and the like) by screws.

The fixed portion 52 of the second rigid second substrate 7 has two insertion holes 53 and 54 defined therein into which fixed screws are inserted. The two insertion holes 53 and 54 are defined in the direction in which the sixth upper reference portion S6 is extended at a predetermined interval. The two insertion holes 53 and 54 may play a role similar to that of the two positioning holes 38A and 38B of the first rigid first substrate 3 serving as a positioning reference required when this circuit substrate 1 is manufactured.

The first surface serving as the surface of the second rigid second substrate 7 has a plurality of electronic parts 57 such as resistors and capacitors mounted thereon as shown in FIG. 6. These electronic parts 57 can be electrically connected to predetermined portions of the wiring pattern by through-holes bored at predetermined positions. Also, as shown in FIG. 7, the second surface serving as the back of the second rigid second substrate 7 has a plurality of land holes 51 extended through the coating layer to expose a part of the inside conductive layer.

A plurality of land holes 51 may be located at the positions corresponding to a plurality of land holes 15 bored on the second surface of the second substrate mounting portion 2b at the identical interval. More specifically, a plurality of land holes 51 may be formed with a distance a in the horizontal direction in which the sixth upper reference portion S6 is extended and they are also formed with a distance b in the longitudinal direction in which the sixth horizontal reference portion T6 is extended. These distances a and b are set to be an equal length (distance a=b) in this embodiment and they are 2 mm, for example. Then, the land hole 51 of the first row from the upper direction is set to the position distant from the upper reference portion S6 to the longitudinal direction with a distance b4. Also, the land hole 51 of the first row from the right is set to the position distant from the horizontal reference portion T6 to the horizontal direction with a distance a4. When the second substrate mounting portion 2b and the first rigid second substrate 4 are properly positioned by this second rigid second substrate 7, the upper reference portion S6 may agree with the upper reference portion S4 of the first rigid second substrate 4 and the horizontal reference portion T6 may agree with the horizontal reference portion T4 of the first rigid second substrate 4.

The second rigid second substrate 7 having the above-mentioned arrangement is supported to the second base member 25 by three bridging pieces 37. The three bridging piece 37 may be formed by removing three portions of the slits surrounding the circumference of the second rigid second substrate 7 and they are located in such a manner as to support the second rigid second substrate 7 from the three directions.

Consequently, the second rigid second substrate 7 is placed on the second substrate mounting portion 2b of the flexible wiring board 2 and the first rigid second substrate 4 in such a manner that the upper reference portions S2, S4 and S6 and the horizontal reference portions T2, T4 and T6 may agree with each other, whereby a plurality of land holes 28 of the first rigid second substrate 4 can be properly positioned to a plurality of land holes 14 of the second substrate mounting portion 2b, respectively. As a result, both of the land holes 15 and 28 can be accurately placed one upon another. A second rigid flexible portion 58 can be constructed by the first rigid second substrate 4, the second substrate mounting portion 2b and the second rigid second substrate 7 which are laminated in a three-layer fashion and of which predetermined portions are electrically bonded by a suitable method such as through-holes and soldering.

Solder may be printed on the portions opened by the land holes 10, 11, 14, 15, 16, 27, 28, 29, 30, 31, 50 and 51 and the portions on which solder might be printed may construct the land portions. More specifically, the "land portion" means a "bonded portion" which is to be soldered by a suitable method such as a reflow process.

The circuit substrate 1 having the above-mentioned arrangement can be manufactured as follows, for example. First, the flexible wiring board 2 having the arrangement shown in FIGS. 3A and 3B, the first printed circuit wiring board 21 having the arrangement shown in FIGS. 4 and 5 and the second printed circuit wiring board 22 having the arrangement shown in FIGS. 6 and 7 are prepared. Next, as shown in FIGS. 4 and 6, predetermined electronic devices, electronic parts and the like are mounted on the first surface of the first printed circuit wiring board 21 and the first surface of the second printed circuit wiring board 22, respectively.

More specifically, as shown in FIG. 4, the terminal portion 39 is mounted at the predetermined position of the first surface of the first rigid first substrate 3 of the first printed circuit wiring board 21. The two gyro sensors 41 and 42, the microcomputer 43 and other necessary electronic parts are mounted at the predetermined positions of the first surface of the first rigid second substrate 4. Also, the connector 45 is mounted at the predetermined position of the first surface of the third rigid substrate 5. Similarly, as shown in FIG. 6, other necessary electronic parts 49 such as capacitors and resistors are mounted at the predetermined positions of the first surface of the second rigid first substrate 6 of the second printed circuit wiring board 22. Then, necessary electronic parts 57 such as resistors are mounted at the predetermined positions of the first surface of the second rigid second substrate 7. Then, the second rigid first substrate 6 and the second rigid second substrate 7 are respectively separated from the second printed circuit wiring board 22.

Next, an exclusively-designed jig (not shown) is prepared and the second rigid first substrate 6, the second rigid second substrate 7 and the first printed circuit wiring board 21, which were individually separated, are set to the predetermined positions of such jig in the state in which their second surfaces with the land holes bored thereon are directed upward (that is, the surfaces on which the electronic parts and the like are mounted are directed downward). At that time, the second rigid first substrate 6 is properly positioned to the predetermined position by engaging two positioning pins provided on the jig into the two positioning holes 48A and 48B. Also, the second rigid second substrate 7 is properly positioned to the predetermined position by engaging two positioning pins similarly provided on the jig into the two insertion holes 53 and 54. At that time, the second rigid first substrate 6 and the second rigid second substrate 7 are located such that they may have the same positional relationships (shown in FIGS. 2A and 2B) as those obtained after the circuit substrate 1 was manufactured.

The exclusively-designed jig in which the predetermined rigid substrates are set to the predetermined positions as described above is supplied to a solder printing machine (not shown) and a plurality of land portions to make electric connection may be formed by solder-printing all of the predetermined positions of the land holes provided on the respective rigid substrates. Then, a jig for holding the thus solder-printed substrates is supplied to a solder inspection machine, similarly not shown, and thereby the printed solder states are inspected. Substrates, which stood the solder inspection, may be transported to the next process.

Next, the flexible wiring board 2 is placed on the second rigid first substrate 6 and the second rigid second substrate 7. In this case, the second surface of the flexible wiring board 2 is opposed to the second surfaces serving as the upper surfaces of the two substrates 6 and 7 and the two positioning holes 8A and 8B bored on the first substrate mounting portion 2a are fitted into the two positioning pins of the jig. As a result, a plurality of land holes 11 bored on the second surface of the first substrate mounting portion 2a may be opposed to a plurality of land holes 50 bored on the second rigid first substrate 6 and land portions printed on the predetermined land holes 50 of the land holes 50 may be connected to the conductive layer of the flexible wiring board 2 through the corresponding land holes 11. In a like manner, a plurality of land holes 15 bored on the second surface of the second substrate mounting portion 2b of the flexible wiring board 2 may be opposed to a plurality of land holes 51 bored on the second rigid second substrate 7 and a plurality of land portions printed on predetermined land holes 51 of the land holes 51 may be connected to the conductive layer of the flexible wiring board 2 through the corresponding land holes 15.

Next, the first printed circuit wiring board 21 is removed from the jig and turned over so that the second surface thereof may be opposed to the flexible wiring board 2 on which the first printed circuit wiring board 21 is placed. At that time, the two positioning holes 38A and 38B bored on the first rigid first substrate 3 held on the first printed circuit wiring board 21 are engaged into the two positioning pins of the jig, whereby a plurality of land holes 27 bored on the first rigid first substrate 3 may be opposed to a plurality of land holes 10 bored on the first surface of the first substrate mounting portion 2a. As a result, a plurality of land portions printed on predetermined land holes 27 of a plurality of land holes 27 of the first rigid first substrate 3 may be connected through the land holes 10 of the first substrate mounting portion 2a to the conductive layer of the flexible wiring board 2.

Similarly, a plurality of land holes 28 bored on the first rigid second substrate 4 may be opposed to a plurality of land holes 14 bored on the first surface of the second substrate mounting portion 2b. As a consequence, a plurality of land portions printed on predetermined land holes 28 of a plurality of land holes 28 of the first rigid second substrate 4 may be connected through the land holes 14 of the corresponding second substrate mounting portion 2b to the conductive layer of the flexible wiring board 2.

Also, the third rigid substrate 5 provided on the first printed circuit wiring board 21 is placed on the third substrate mounting portion 2c of the flexible wiring board 2. Thus, a plurality of land holes 29 bored on the second surface of the third rigid substrate 5 may be opposed to a plurality of land holes 16 bored on the third substrate mounting portion 2c, and a plurality of land portions printed on predetermined land holes 29 of the land holes 29 may be connected through the corresponding land holes 16 to the conductive layer of the flexible wiring board 2. As a consequence, five (five kinds of) rigid substrates 3 to 7 can be electrically conducted each other through the flexible wiring board 2.

Next, in the state in which a weight (not shown) is attached to the jig and the above-described conducted state is maintained, the jig is passed through a reflow furnace (not shown). When the jig is passed through this reflow furnace, the above-described land portions are melted and soldered to the conductive layer of the flexible wiring board 2. Thus, the rigid substrates are integrally attached to the predetermined positions of both of the front and back of the flexible wiring board 2 and a first rigid flexible portion 55 and a second rigid flexible portion 58 in which both surfaces of a part of the flexible wiring board 2 are sandwiched by the two rigid substrates are constructed.

After that, the weight is removed from the jig, and further the first printed circuit wiring board 21 is removed from the jig. Then, the three bridging pieces 33 of the first rigid substrate 3 held on the first printed circuit wiring board 21, the three bridging pieces 34 of the first rigid second substrate 4 held on the first printed circuit wiring board 21 and the two bridging pieces 35 of the third rigid substrate 5 similarly held on the first printed circuit wiring board 21 are cut out, whereby manufacturing of the circuit substrate 1 is completed and the circuit substrate 1 having the shape and the structure shown in FIG. 1 and FIGS. 2A and 2B can be obtained.

FIGS. 8A and 8B are schematic diagrams to which reference will be made in explaining the process to manufacture the circuit substrate 1 shown in FIG. 1. More specifically, FIG. 8A shows the state obtained before the bonding process in which the first and second rigid substrates are located above and below the flexible wiring board and FIG. 8B shows the state obtained after the bonding process. As shown in FIG. 8A, in the first substrate mounting portion 2a of the flexible wiring board 2, a plurality of land holes 10 on the first surface and a plurality of land holes 11 on the second surface may be provided at the positions displaced from each other by a predetermined amount so that they may not be placed one upon another. Similarly in the second substrate mounting portion 2b of the flexible wiring board 2, a plurality of land holes 14 on the first surface and a plurality of land holes 15 on the second surface may be provided at the positions displaced from each other by a predetermined amount so that they may not be placed one upon another.

On the other hand, a plurality of land portions 60 which show a first inventive example of the first land portion provided on a predetermined land hole of a plurality of land holes of the first rigid first substrate 3 may be respectively opposed to a plurality of land holes 10 which show a first inventive example of the third land portion provided on the first surface of the first substrate mounting portion 2a. Also, a plurality of land portions 61 which show a first inventive example of the second land portion provided on a predetermined land hole of a plurality of land holes of the second rigid first substrate 6 may be respectively opposed to a plurality of land holes 11 which show a first inventive example of the fourth land portion provided on the second surface of the first substrate mounting portion 2a.

Similarly, a plurality of land portions 64 which show a second inventive example of the first land portion provided on a predetermined land hole of a plurality of land holes of the first rigid second substrate 4 may be respectively opposed to a plurality of land holes 14 which show a second inventive example of the third land portion provided on the first surface of the second substrate mounting portion 2b. Also, a plurality of land portions 65 which show a second inventive example of the second land portion provided on a predetermined land hole of a plurality of land holes of the second rigid second substrate 7 may be respectively opposed to a plurality of land holes 15 which show a second inventive example of the fourth land portion provided on the second surface of the second substrate mounting portion 2b.

Accordingly, the flexible wiring board 2 is sandwiched by the two rigid substrates as described above, a plurality of land portions opposed to each other in the first surface and the conductive layers exposed to a plurality of third land portions 10 may be soldered together and a plurality of land portions 61 opposed to each other in the second surface and the conductive layers exposed to a plurality of land portions 11 may be soldered together. In this manner, the first rigid flexible portion 55 can be constructed, in which the first substrate mounting portion 2a of the flexible wiring board 2 is sandwiched by the first rigid first substrate 3 and the second rigid first substrate 6.

In a like manner, a plurality of first land portions 64 opposed to each other in the first surface and the conductive layers exposed to a plurality of third land portion 14 may be soldered together and a plurality of second land portions 65 opposed to each other in the second surface and the conductive layers exposed to a plurality of fourth land portions 15 may be soldered together. In this manner, the second rigid flexible portion 58 can be constructed, in which the second substrate mounting portion 2b of the flexible wiring board 2 is sandwiched by the first rigid second substrate 4 and the second rigid second substrate 7.

According to the above-mentioned circuit substrate 1, since the flexible wiring board 2 is sandwiched by the two rigid substrates in the rigid flexible portions 55 and 58, a large number of electronic devices, electronic parts and the like can be efficiently mounted on the narrow space and it is possible to realize high-density mounting. In addition, since the portions other than the rigid flexible portions 55 and 58 may form the flexible wiring board 2, characteristics of the flexible wiring board 2 with flexibility can be used effectively and it is possible to realize various mounting forms by flexing the flexible portion.

When this circuit substrate 1 is manufactured, if the solder amount of the land portion is insufficient so that the land portion is cracked or if on the other hand the solder amount is so large that extra solder is forced out of the land portion, then electric circuits are short-circuited (shorted) or wires are broken in the rigid flexible portions 55 and 58. As a result, it is unavoidable that various connection failures will arise.

FIG. 9 is a diagram showing an X-ray photograph obtained by taking an X-ray of a manufactured product in which connection failures occurred in the second rigid flexible portion 58 of the circuit substrate 1 manufactured as mentioned before. This X-ray photograph shows the manufactured product, particularly, the second rigid flexible portion 58 from the direction perpendicular to one surface (first surface in this embodiment) of the flexible wiring board (this X-ray photograph may show the manufactured product, particularly, the second rigid flexible portion 58 from the direction perpendicular to the second surface which is the other surface of the flexible wiring board). FIG. 10 is an explanatory diagram used to explain main portions of the X-ray photograph shown in FIG. 9. As shown in FIG. 10, the second rigid flexible portion 58 is composed of the second substrate mounting portion 2c of the flexible wiring board 2 (not shown) and the first rigid second substrate 4 and the second rigid second substrate 7 both of which sandwich the second substrate mounting portion 2c from both sides.

As shown in FIG. 11, a plurality of land portions 70 and 71 may be arrayed on the second surface of the first rigid second substrate 4 in a lattice fashion. Also, as shown in FIG. 12, a plurality of land portions 72 and 73 may be arrayed on the second surface of the second rigid second substrate 7 excepting unnecessary portions in a lattice fashion. In FIGS. 11 and 12, the land portions 70 and 72 shown by solid circles illustrate land portions in which tip end portions of a conductive metal are circular, and the land portions 71 and 73 shown by open circles having cross-shaped centers illustrate land portions in which tip end portions of a conductive metal are substantially cross-shaped. Different shapes of the tip end portions are shown by the X-ray photograph of FIG. 9.

Now, of the land portions 70 and 71 located on the uppermost stage of the first ridge second substrate 4 shown in FIG. 11, there are provided a first land portion 71a, a second land portion 71b and a third land portion 71c from the side of the hook-like projected portion 4a, in that order. On the second stage and the third stage from above, there are provided a fourth land portion 70a and a fifth land portion 70b. Also, on the land portion 72 located on the side of the hook-like projected portion 7a of the second ridge second substrate 7 shown in FIG. 12, there are provided a first land portion 72a, a second land portion 72b and a third land portion 72c from above and from the side of the hook-like projected portion 7a, in that order. These land portions 70a, 70b, 71a, 71b, 71c and 72a, 72b and 72c are obtained as shown in FIG. 10 in the X-ray photograph shown in FIG. 9.

Here, a study of the X-ray photograph shown in FIG. 9 reveals that a large number of land portions have substantially similar shapes as those of individual land portions, and the land portions identical to those of the original land portions in shape may show the portions which are connected correctly. On the other hand, while the land portion 72a shown by an arrow Z in FIG. 9 is circular in the beginning, it is deformed like nearly a diamond-shape in the X-ray photograph shown in FIG. 9. In addition, part of the land portion 72a is projected in the lateral direction and this land portion 72a has an unusual shape. This unusual shape of the land portion 72a may demonstrate that the land portion 72a is not bonded correctly. Therefore, it is possible to accurately judge the soldered state of the land portion by examining the bonded state of the land portion with reference to X-ray photographs.

As described above, it is possible to effectively prevent defective circuit substrates 1 from being used inadvertently by inspecting the soldered states of the circuit substrates 1 one by one. Therefore, a yield obtained when this circuit substrate 1 is applied to a camera apparatus such as a video camera, which will be described later on, can be increased and hence it is possible to improve productivity of this kind of camera apparatus.

The circuit substrate 1 having the above-mentioned arrangement is suitable for use with a video camera 80 which shows a first inventive example of a camera apparatus shown in FIG. 13, for example. This vide camera 80 uses a semiconductor recording media as an information recording medium and converts an optical image from an object into an electric signal by a CCD (charge-coupled device) so that such electric signal can be recorded on the semiconductor recording media or that such electric signal can be displayed on a display apparatus such as a liquid-crystal display.

However, it is needless to say that the information recording medium is not limited to the above-described semiconductor recording media and that tape-like recording mediums such as a magnetic tape, disc-like recording mediums such as an optical disc, a magneto-optical disc and a magnetic disc and other information recording mediums can be applied to the above-described information recording medium.

As shown in FIG. 13, this video camera 80 includes a camera body 81, a lens apparatus 83 for obtaining an object image as light and introducing this light into a CCD 82 serving as an image pickup device, a display apparatus 94 formed of a liquid-crystal display panel to display images based on a video signal outputted from the CCD 82, a control apparatus for controlling operations of the lens apparatus 83 and a liquid-crystal display 95, a battery power supply and the like.

The camera body 81 is formed of a longer flat case which is further extended in the depth direction and a camera lens of the lens apparatus 83 is located on the upper portion of the front of the camera body 81. The lens apparatus 83 includes a lens lens-barrel 84 formed of substantially a square cylinder of a square shape and the top portion of the lens lens-barrel 84 is fixed to the camera body 81. The lens lens-barrel 84 houses therein a lens system formed of a combination of a plurality of lenses and the lens lens-barrel 84 is attached to the camera body 81 in such a manner that the optical system of the lens system may be extended in the horizontal direction. The first rigid flexible portion 55 of the circuit substrate 1 is fixed to the rear end portion of this lens lens-barrel 84.

The CCD 82 is mounted on the surface which is the first surface of the first rigid first substrate 3 of the first rigid flexible portion 55 and the CCD 82 is fixed to the lens lens-barrel 84 through this first rigid flexible portion 55. The CCD 82 is located on the optical axis of the lens system and a focal point of the lens system is focused on its focusing plane to thereby focus an image of an object. The second rigid flexible portion 58 is located behind the optical axis of the first rigid flexible portion 55 with a proper spacing in an opposing fashion such that it may become substantially parallel to the first rigid flexible portion 55.

In order to set up these elements and parts in the same manner as described above, the first joint portion 2d for joining the first rigid flexible portion 55 and the second rigid flexible portion 58 may be bent in its intermediate portion. In this case, since the first joint portion 2d may function as the flexible wiring board itself, it has sufficiently large flexibility and it can easily be bent with a proper radius of curvature without producing resistance. As a consequence, the second rigid flexible portion 58 can be made close to the first rigid flexible portion 55 and they can be parallelly opposed to each other such that they may be placed one upon another. Accordingly, since a plurality of rigid flexible portions 55 and 58 can be located within the narrow space, it is possible to use the space within the camera body 81 more effectively.

The second rigid flexible portion 58 is fixed to a body side mechanical chassis 85 fixed to the camera body 81 by a plurality of fixed screws 86. This second rigid flexible portion 58 is attached to the body side mechanical chassis 85 by the fixed portion 52 provided on the second rigid second substrate 7.

More specifically, as shown in FIGS. 14 and 15 in an enlarged-scale, the fixed portion 52 is fixed to the body side mechanical chassis 85 by respectively inserting shaft portions of fixed screws 86 into two insertion holes 53 and 54 of the fixed portion 52. The second rigid second substrate 7 having the above-mentioned fixed portion 52 is provided and this second rigid second substrate 7 may be curved by the first joint portion 2d owing to flexibility of the flexible wiring board, whereby a plurality of rigid flexible portions can be disposed within the narrow space, freedom in the layout form can be increased and the space within the camera body 81 can be used more effectively.

Also, the second joint portion 2e of the circuit substrate 1 is bent forwards 90 degrees at its portion in which it is projected from the first rigid flexible portion 55. Then, a connector provided on the third rigid substrate 5 fixed to the other end of the second joint portion 2e is connected to a body-side connection fitting provided on a body-side printed circuit board 88. The body-side printed circuit board 88 is spread in the front and back direction of the camera body 81 and a microcomputer constructing the control apparatus for controlling operations of the whole of the video camera and other portions and other electronic parts are mounted on the body-side printed circuit board 88. Although not shown, the camera body 81 has a recording and reproducing apparatus built therein to record and reproduce camera information converted into an electric signal by the CCD 82. Also, batteries for supplying power to the recording and reproducing apparatus and other apparatus/mechanisms are detachably attached to the camera body 81.

An electronic viewfinder 90 for displaying an object image inputted through the lens apparatus 83 is disposed on the upper portion of the back of the camera body 81. Also, a power switch 91 for energizing and de-energizing a battery power supply and a start/stop button 92 for starting and stopping shooting are disposed under the electronic viewfinder 91 at the back of the camera body 81.

The display apparatus 94 to display an object image based on the electric signal outputted from the CCD 82 is attached to one side portion of the camera body 81. The display apparatus 94 includes the display panel 95 formed of a suitable device such as a liquid-crystal display to display pictures, a panel holder 96 to hold this display panel 95 and the like. The panel holder 96 is attached to the camera body 81 by a biaxial rotating portion 97 such that it may change its attitude freely. When the panel holder 96 is rotated around this biaxial rotating portion 97, the panel holder 96 is able to take various attitudes of the states such as the state in which the display panel 95 is directed to the back side as shown in FIG. 13, the state in which the display panel 95 is directed to the front side after the panel holder 96 was rotated 180 degrees in the front and back direction from the state in which the display panel 95 was directed to the back side and the state in which panel holder 96 is made close to the side surface of the camera body 81.

FIG. 16 is a block diagram showing an embodiment of a schematic arrangement of the video camera having the aforementioned arrangement. As shown in FIG. 16, this video camera 80 includes the lens apparatus 83 having an image shake correcting apparatus 98, a video recording and reproducing unit 100 that may play a leading role of the control apparatus, a built-in memory 101 including a program memory, a data memory to drive the video recording and reproducing unit 100 and other memories such as a RAM (random-access memory) and a ROM (read-only memory), a video signal processing unit 102 for processing shot images and the like to provide a predetermined signal, the display apparatus 94 for displaying shot images and the like, an external memory 103 for expanding a storage capacity, a correcting lens control unit 104 for controlling driving of the image shake correcting apparatus 98 and the like.

The video recording and reproducing unit 100 includes an arithmetic circuit having a microcomputer (CPU) and the like, for example. This video recording and reproducing unit 100 may include a mechanical deck unit for use with a VTR (video tape recorder) using a magnetic tape as an information recording medium and a hard disk drive (HDD) using a disc-like recording medium such as an optical disc, a magneto-optical disc and a magnetic disc as an information recording medium according to he needs. Also, the video recording and reproducing unit 100 may include a recording and reproducing apparatus using a semiconductor memory as an information recording medium.

This video recording and reproducing unit 100 is connected with the built-in memory 101, the video signal processing unit 102, the correcting lens control unit 104, a monitor driving unit 105, an amplifier 106 and two interfaces (I/F) 107 and 108. The video signal processing unit 102 is connected to the CCD 82 attached to the lens apparatus 83 through the amplifier 106 and a signal processed as a predetermined video signal is inputted to the video recording and reproducing unit 100. The display apparatus 94 is connected through the monitor driving unit 105 to the video recording and reproducing unit 100. A connector 109 is connected to the first interface (I/F) 107 and the external memory 103 is detachably connected to the connector 109. A connection terminal 110 provided on the camera body 81 is connected to the second interface (I/F) 108.

The first gyro sensor 41 is connected through a third interface (I/F) 111 to the correcting lens control unit 104. The second gyro sensor 42 is connected through a fourth interface (I/F) 112 to the correcting lens control unit 104. These first and second gyro sensors 41 and 42 are adapted to correct image shake of the lens apparatus 83 by the image shake correcting apparatus 98. The first and second sensors 41 and 42 are able to detect displacement generated by pitching and yawing applied to the camera body 81 as acceleration and they are adapted to use detected acceleration as information to correct image shake.

Further, the image shake correcting apparatus 98 includes a lens driving unit (not shown). This lens driving unit is connected to the correcting lens control unit 104 and it is adapted to drive the correcting lens 99 in the first direction (direction perpendicular to the optical axis of the lens system 87) and to drive the correcting lens 99 in the second direction (the direction perpendicular to the optical axis of the lens system 87 and which direction is also perpendicular to the first direction). Then, a position detecting sensor 113 to detect the positions at which the correcting lens 99 is located in the first direction and the second direction is connected to the image shake correcting apparatus 98.

Thus, when the object image is inputted to the lens system 87 of the lens apparatus 83 and focused on the focusing plane of the CCD 82, a resultant video signal is inputted through the amplifier 106 to the video signal processing unit 102. A signal processed as a predetermined video signal by this video signal processing unit 102 is inputted to the video recording and reproducing unit 100, whereby a signal corresponding to the object image is outputted from the video recording and reproducing unit 100 to the monitor driving unit 105, the built-in memory 101 or the external memory 103. As a result, a picture corresponding to the object image is displayed on the display apparatus 94 through the monitor driving unit 105. Alternatively, the above picture corresponding to the object image may be stored in the built-in memory 101 or the external memory 103 as an information signal if necessary.

When the image shake correcting apparatus 98 is set to the operable state in this shooting condition, if pitching and yawing are applied to the camera body 81, then the two gyro sensors 41 and 42 detect such pitching and yawing and output detected signals through the correcting lens control unit 104 to the video recording and reproducing unit 100. When receiving the above detected signals, the video recording and reproducing unit 100 executes predetermined calculation processing and outputs a control signal to control operations of the image shake correcting apparatus 98 to the correcting lens control unit 104. This correcting lens control unit 104 outputs a predetermined drive signal to the image shake correcting apparatus 98 based on the control signal from the video recording and reproducing unit 100 so that the correcting lens 99 may be moved by predetermined amounts in the first direction and/or second direction. As a result, image shake can be removed by movement of the correcting lens 99 and hence beautiful pictures can be obtained.

As set forth above, according to the circuit substrate of the present invention, the structure by which the mounting form and the high density mounting equivalent to those of the rigid flexible substrate can be realized can be realized by bonding the rigid substrates and the flexible wiring boards and a new mounting system can be provided. Also, freedom in circuit design can be increased by a flexible structure equivalent to the rigid flexible substrate. In addition, since electronic devices, electronic parts and the like are mounted on both surfaces of the rigid substrate, it is possible to realize the high density mounting. Further, although the related-art rigid flexible substrate needs a large number of manufacturing processes and its degree of difficulty in the manufacturing process is high so that the related-art rigid flexible substrate has to become expensive from a money standpoint, according to the present invention, it is sufficient that the rigid substrates and the flexible wiring boards may be bonded. As a result, the cost can be reduced and hence the circuit substrate can be manufactured inexpensively. Then, by using the aforementioned jig and the like, the manufacturing process can be simplified and a yield of the circuit substrate can be improved.

The present invention is not limited to the embodiments of the present invention that has been described so far with reference to the accompanying drawings and it can be variously modified without departing from the gist thereof. For example, while the rigid substrates and the flexible wiring boards are constructed so as to have the three-layer structure in the above-described embodiments of the present invention, the present invention is not limited thereto and it is needless to say that the rigid substrates and the flexible wiring boards may be further laminated to provide a laminated layer structure having layers more than four or five layers. Further, while the video camera is applied to the camera apparatus in the above-described embodiments of the present invention, the present invention is not limited thereto and it is needless to say that the present invention can be applied to other camera apparatus such as a digital still camera, a personal computer having a built-in camera and a mobile phone having a built-in camera.

It should be understood by those skilled in the art that various modifications, combinations, sub-combinations and alterations may occur depending on design requirements and other factors insofar as they are within the scope of the appended claims or the equivalents thereof.

What is claimed is:

1. A circuit substrate comprising:
a first rigid substrate having a plurality of land portions located at a predetermined interval on one surface;
a second rigid substrate having a plurality of second land portion located at a predetermined interval on one surface; and
a flexible wiring board sandwiched by said first and second rigid substrates and which has a plurality of third land portions corresponding to said plurality of first land portions on one surface and a plurality of fourth land portions corresponding to said plurality of second land portions on the other surface, wherein said plurality of second land portions and said plurality of fourth land portions are displaced from each other relative to said plurality of first land portions and said plurality of third land portions and at least part of said plurality of first land portions and said plurality of third land portions and at least part of said plurality of second land portions and said plurality of fourth land portions are electrically connected to each other, respectively;
wherein said first rigid substrate, said second rigid substrate and said flexible wiring board have positioning holes to properly position said plurality of first land portions and said plurality of third land portions and to properly position said plurality of second land portions and said plurality of fourth land portions, respectively.

2. A circuit substrate according to claim 1, wherein said first and second rigid substrates have electronic parts mounted on at least one of a surface opposite to the surface on which said plurality of first land portions are located and a surface opposite to the surface on which said plurality of second land portions are located.

3. A circuit substrate comprising:
a first rigid substrate having a first plurality of land portions mounted in a first lattice fashion over one surface;
a second rigid substrate having a second plurality of land portions mounted in a second lattice fashion over one surface; and
a flexible wiring board, at least a portion of which is sandwiched by said first and second rigid substrates, and which has a third plurality of land portions on a first area on a first surface and fourth plurality of land portions on a second area on a second surface, the first area overlapping the second area on opposite sides of the flexible wiring board;
wherein:
the third plurality of land portions mounted on the first area in the first lattice fashion;
the fourth plurality of land portions mounted on the second area in the second lattice fashion;
the individual land portions in the third plurality of land portions do not overlap the portion of the flexible substrate that the individual land portions in the fourth plurality of land portions overlap;
at least a portion of the first plurality of land portions and at least a portion of the third plurality of land portions are connected; and
at least a portion of the second plurality of land portions and at least a portion of the fourth plurality of land portions are connected.

4. A circuit substrate according to claim 3, wherein the first rigid substrate, the second rigid substrate and the flexible wiring board include a plurality of positioning holes prior to the first rigid substrate, the second rigid substrate and the flexible wiring board being connected, for properly positioning the first plurality of land portions relative to the third plurality of land portions and to properly position the second plurality of land portions relative to the fourth plurality of land portions.

5. A circuit substrate according to claim 3, wherein at least one of:
the first rigid substrate has electronic components mounted on a surface opposite to the surface on which said first plurality of land portions are located; and
the second rigid substrate has electronic components mounted on a surface opposite to the surface on which said second plurality of land portions are located.

6. A circuit substrate according to claim 3, wherein
at least a portion of the first plurality of land portions and at least a portion of the third plurality of land portions are connected electronically; and
at least a portion of the second plurality of land portions and at least a portion of the fourth plurality of land portions are connected electronically.

7. A circuit substrate according to claim 3, further comprising:
at least a portion of the first plurality of land portions and at least a portion of the third plurality of land portions are physically connected; and
at least a portion of the second plurality of land portions and at least a portion of the fourth plurality of land portions are physically connected.

8. A circuit substrate according to claim 3, wherein:
the land portions mounted in the first lattice fashion are distributed in equal intervals along a first dimension and second dimension; and
the land portions mounted in the second lattice fashion are distributed in equal intervals along the first dimension and second dimension.

9. A circuit substrate according to claim 3, wherein:
The land portions mounted in the first lattice fashion are distributed in the same pattern as the land portions mounted in the second lattice fashion, with the first lattice fashion being offset from the second lattice fashion by at least one of a horizontal and vertical direction.

10. A circuit substrate according to claim 3, further comprising:
a third rigid substrate having a fifth plurality of land portions mounted in a third lattice fashion over one surface;
a fourth rigid substrate having a sixth plurality of land portions mounted in a fourth lattice fashion over one surface; and
a portion of the flexible wiring board being sandwiched by the third and fourth rigid substrates, and
the flexible wiring board further including a seventh plurality of land portions on a third area on the first surface and an eighth plurality of land portions on a fourth area on the second surface, the third area on the first surface overlapping the fourth area on the second surface;
wherein:
the seventh plurality of land portions are mounted on the third area in the first lattice fashion;
the eighth plurality of land portions mounted on the fourth area in the second lattice fashion;
the individual land portions in the seventh plurality of land portions do not overlap the portion of the flexible substrate which the individual land portions in the eighth plurality of land portions overlap;

at least a portion of the fifth plurality of land portions and at least a portion of the seventh plurality of land portions are connected; and at least a portion of the sixth plurality of land portions and at least a portion of the eighth plurality of land portions are connected.

11. A circuit substrate according to claim 10, wherein:

the at least a the portion of the flexible wiring board sandwiched by said first and second rigid substrate and the portion of the flexible wiring board sandwiched by said third and fourth rigid substrates is separated by a section of flexible wiring board that is not connected to any rigid substrate.

12. A circuit substrate according to claim 10, wherein:

the first lattice fashion is the same as the third lattice fashion; and the second lattice fashion is the same as the fourth lattice fashion.

* * * * *